United States Patent
Horiguchi

(10) Patent No.: US 7,042,040 B2
(45) Date of Patent: May 9, 2006

(54) SEMICONDUCTOR DEVICE AND METHOD FOR MANUFACTURING THE SAME

(75) Inventor: Fumio Horiguchi, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/762,470

(22) Filed: Jan. 23, 2004

(65) Prior Publication Data

US 2004/0150028 A1    Aug. 5, 2004

Related U.S. Application Data

(62) Division of application No. 09/949,634, filed on Sep. 12, 2001, now abandoned.

(30) Foreign Application Priority Data

Sep. 11, 2000 (JP) ............................. 2000-275336

(51) Int. Cl.
*H01L 27/108* (2006.01)

(52) U.S. Cl. ...................... 257/301; 257/296; 257/300; 257/302; 257/303

(58) Field of Classification Search ................ 257/68, 257/71, 300–303, 315–316, 277, 516, 532, 257/296, 298, 905–908
See application file for complete search history.

(56) References Cited

U.S. PATENT DOCUMENTS 4,419,743 A   12/1983 Taguchi et al.
4,979,014 A   12/1990 Hieda et al.
5,250,830 A   10/1993 Yagishita et al.
5,258,635 A   11/1993 Nitayama et al.
5,350,708 A    9/1994 Yagishita et al.
5,504,357 A    4/1996 Kim et al.
5,736,761 A    4/1998 Risch et al.
5,977,589 A   11/1999 Schloesser et al.

(Continued)

FOREIGN PATENT DOCUMENTS

JP   57-23261   2/1982

(Continued)

OTHER PUBLICATIONS

Masao Taguchi et al., "A Capacitance-Coupled Bit-Line Cell for Mb Level DRAMs," ISSCC 84, Feb. 22, 1984, pp. 100-101.

*Primary Examiner*—Nathan J. Flynn
*Assistant Examiner*—Johannes Mondt
(74) *Attorney, Agent, or Firm*—Oblon, Spivak, McClelland, Maier & Neustadt, P.C.

(57) ABSTRACT

A semiconductor memory device comprises select transistors formed on side surfaces of plural silicon columns defined by a grid-like trenches on a surface of a silicon substrate, each select transistor having a source and a drain on the top surface and the bottom of the silicon column. A capacitor is formed on the top surface of the silicon column to form a DRAM cell. The source/drain layers on the bottom of a greater number of memory cells are commonly connected, or the source/drain layers on the bottom of adjacent memory cells are commonly connected, to be brought out to the surface of the silicon substrate by a connection line to be connected to a constant voltage or a bit line.

11 Claims, 33 Drawing Sheets

U.S. PATENT DOCUMENTS

| | | |
|---|---|---|
| 6,075,265 A | 6/2000 | Goebel et al. |
| 6,093,614 A * | 7/2000 | Gruening et al. ........... 438/388 |
| 6,172,391 B1 * | 1/2001 | Goebel et al. ............... 257/305 |
| 6,198,158 B1 * | 3/2001 | Clampitt ..................... 257/623 |
| 6,201,730 B1 * | 3/2001 | Alsmeier et al. ........... 365/149 |
| 6,355,954 B1 | 3/2002 | Gall et al. |
| 6,593,613 B1 | 7/2003 | Alsmeier et al. |

FOREIGN PATENT DOCUMENTS

| | | |
|---|---|---|
| JP | 62-155557 | 7/1987 |
| JP | 8-34302 | 3/1996 |
| JP | 2519216 | 5/1996 |
| JP | 8-330545 | 12/1996 |

* cited by examiner

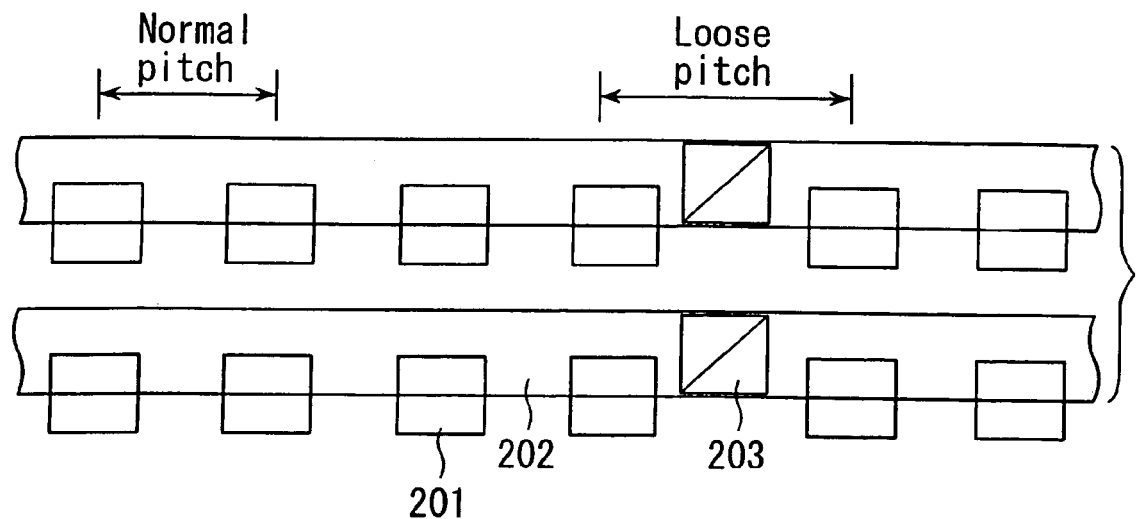
FIG. 56
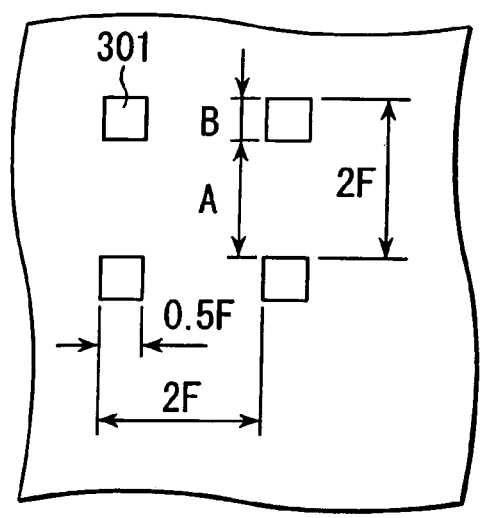
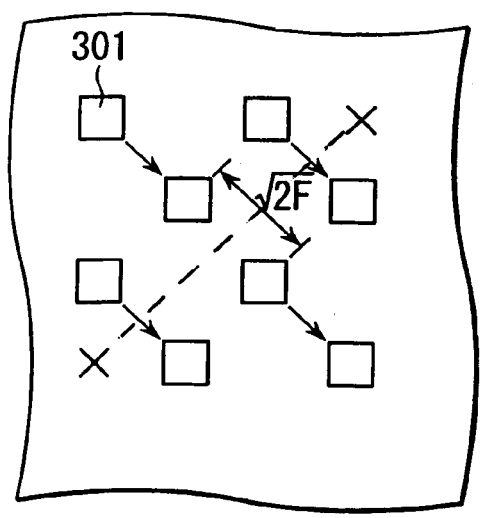
FIG. 57A                FIG. 57B

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2000-275336, filed Sep. 11, 2000, the entire contents of which are incorporated herein by reference.

BACKGROUND OF THE INVENTION

1. Field of the Invention

The present invention relates to a dynamic random access memory (DRAM) and, in particular, to the technique for achieving a high density integration for memory cells.

2. Description of the Related Art

In the conventional DRAM memory cell, use has been made of a memory cell of one transistor and one capacitor. With a recent higher density integration of a semiconductor memory device, there is a growing demand for achieving more reduction of the memory cell's occupation area.

FIG. 1A is an equivalent circuit for a conventional memory cell, FIG. 1B is a view showing a planar layout of it and FIG. 1C shows a cross-section as taken along the line 1C—1C in FIG. 1B. As shown in FIGS. 1B and 1C, the occupation area of one memory cell is determined by one planar type transistor Q, one bit line contact 3 for two cells, storage node contact 4, passing word line 2' and element isolation region 5. With a minimal work dimension given by F at the state of the art and each one side of the gate electrode and source/drain region given by F, the minimal occupation area of the memory cell becomes "2F in length×4F in width"=an area $8F^2$. In such an element configuration, it is not possible to reduce its dimension any more and hence to achieve the reduction of a resultant chip size. It is desired that, in order to obtain a low-cost DRAM, more size-reducible element configuration be adopted. It is to be noted that, in FIGS. 1A to 1C, reference numeral 1 shows a bit line; 2, a word line and 6, a plate electrode line.

Therefore, there is a need for providing a memory cell structure capable of reducing the occupation area of the memory cell down to $4F^2$ or below.

BRIEF SUMMARY OF THE INVENTION

A semiconductor memory device according to a first aspect of the present invention comprises:
a silicon substrate having a major surface;
a plurality of silicon columns formed on the major surface of the silicon substrate;
a plurality of transistors formed on the side surface of the respective silicon columns, each of the transistors comprising
a first impurity layer formed on an upper surface of corresponding one of the silicon columns and serving as one of a source and a drain;
a second impurity layer formed on a bottom of a trench adjacent to the corresponding one of the silicon columns and serving as the other of the source and the drain and, together with the second impurity layer of the rest of the transistors, connected to a constant voltage terminal;
a channel portion formed on a side surface of the corresponding one of the silicon columns between the first impurity layer and the second impurity layer;
a gate insulating film formed on the channel portion; and
a gate electrode formed over the channel portion with the gate insulating film interposed therebetween; and
a plurality of capacitors each having two electrodes, one of the two electrodes being connected to the first impurity layer.

A semiconductor memory device according to a second aspect of the present invention comprises:
a silicon substrate of a first conductivity type having a grid-like trench extending in an x direction and a y direction substantially orthogonal to the x direction on a major surface thereof, the trench having a width A;
a plurality of silicon columns formed on the major surface of the substrate and having a square upper surface defined by the trench, the square upper surface having a side length B;
a plurality of the transistors each formed on a side surface of the respective silicon columns, each of the transistors comprising
a first impurity layer formed on the square upper surface of corresponding one of the silicon columns and serving as one of a source and a drain;
a second impurity layer formed on a bottom of the trench adjacent to the corresponding one of the silicon columns and serving as the other of the source and the drain;
a channel portion formed on a side surface of the corresponding one of the silicon columns between the first impurity layer and the second impurity layer;
a gate insulating film formed on the channel portion; and
a gate electrode formed over the channel portion with the gate insulating film interposed therebetween; and
a plurality of capacitors each having two electrode, one of the two electrodes being connected to the first impurity layer.

BRIEF DESCRIPTION OF THE SEVERAL VIEWS OF THE DRAWING

FIG. 56 shows a model layout diagram of a memory cell structure according to a fifth embodiment, showing a state in which a source/drain layer at the lower sides of the silicon columns is shared among a greater number of memory cells and a contact for line connection is formed at the source/drain layer; and FIGS. 57A and 57B are a model plan view for explaining the manufacturing method of a memory cell structure according to a sixth embodiment as will be set out in conjunction with the manufacturing of a memory cell having a cell size of $2F^2$ or below.

DETAILED DESCRIPTION OF THE INVENTION

The embodiments of the present invention will be described below with reference to the accompanying drawings.

First Embodiment

Figure 2A:
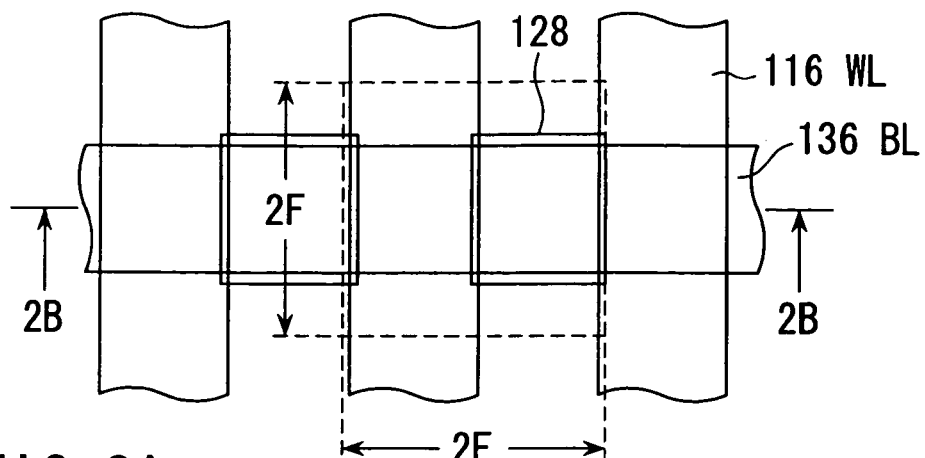
FIG. 2A is a planar layout diagram of a memory cell according to a first embodiment of the present invention.
Figure 2B:
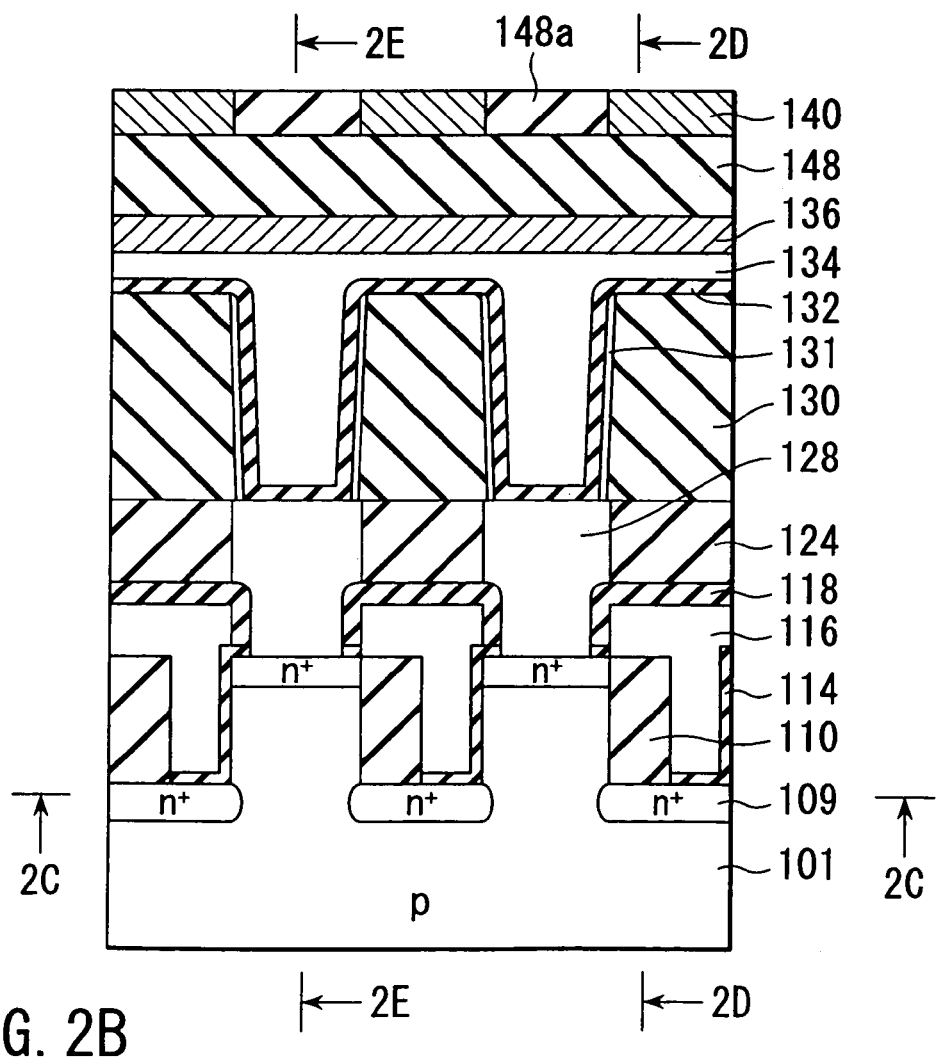
FIG. 2B is a view in vertical cross-section as taken along the line 2B—2B in FIG. 2A.

FIG. 2A is a view showing a planar layout of a memory cell according to a first embodiment of the present invention with mask patterns set in an aligned state as a model layout. FIG. 2B is a cross-sectional view along the line 2B—2B in FIG. 2A. A transistor used for the memory cell of the first embodiment is formed as a vertical type. That is, in FIG. 2B, one of source and drain (impurity layer) 109 is formed at an upper surface of a semiconductor substrate 101 and the other is formed at the bottom of a trench formed on the lower portion of a word line 116. The gate electrode is formed on a side surface of the trench and forms a portion of the word line 116. Above the source/drain layer 109 having a planar configuration at the upper surface of the substrate, a capacitor is formed substantially aligned with that planar configuration. By arranging them in such a way, a memory cell is realized which has a cell area given by $4F^2$ of "2F in length×2F in width" as shown in FIG. 2A.

Figure 2C:
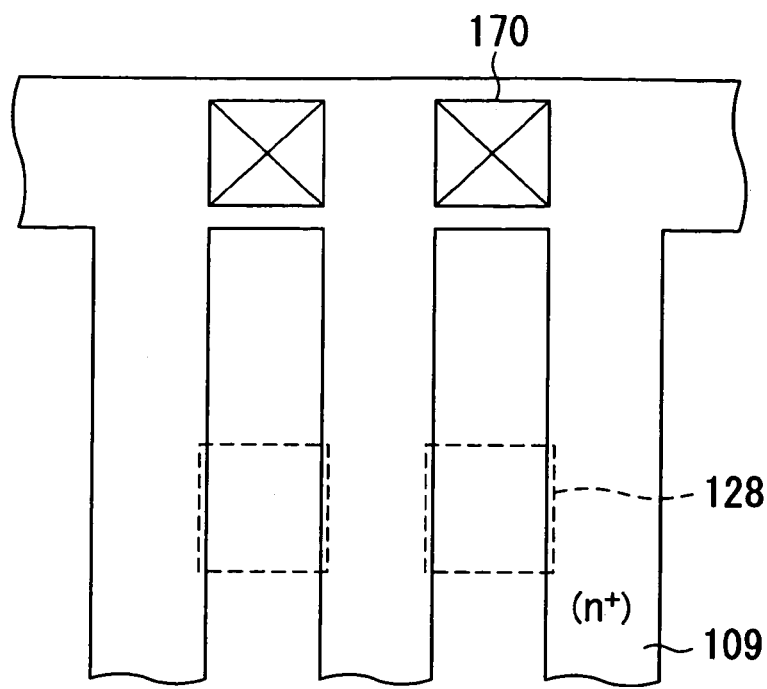
FIG. 2C is a view in lateral cross-section as taken along the line 2C—2C in FIG. 2B showing a terminal end portion of the memory cell array.
Figure 3:
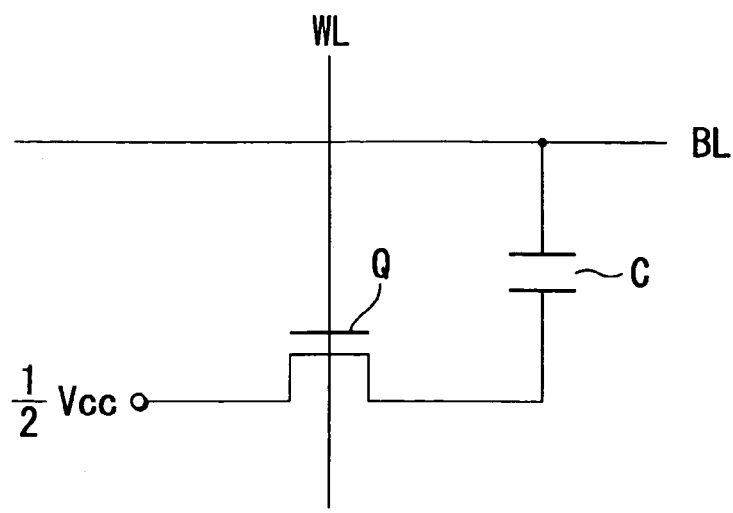
FIG. 3 is an equivalent circuit diagram of the first embodiment.

The equivalent circuit of a first memory cell is as shown in FIG. 3 and one of the source and drain of a select transistor Q is connected to an intermediate potential, for example, Vcc/2 (Vcc: a power supply potential). In FIG. 2B, this one of the source and drain corresponds to the $n^+$ layer 109 at the trench bottom, and the $n^+$ layers 109 of respective transistors are commonly connected, as shown in FIG. 2C, at a terminal end portion of the memory cell array. Reference numeral 170 in FIG. 2C shows a contact for bringing the $n^+$ layer 109 out to the upper surface of the substrate.

FIG. 2b is a view in vertical cross-section as taken along the line 2D—2D in FIG. 2B and shows a memory cell terminal end portion in particular. The $n^+$ layer 109 is connected at the terminal end portion to an n well 171 and one bit memory cell at the cell array terminal end side is formed around a portion between an insulating layer 110 and a bit line 136.

Figure 2D:
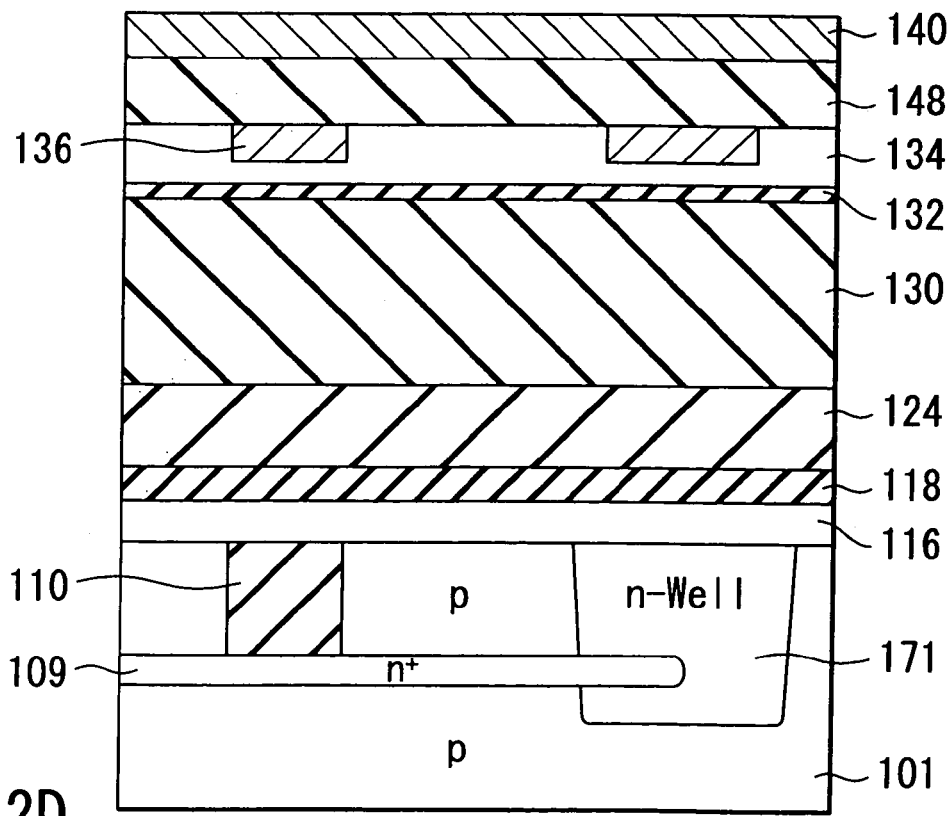
FIG. 2D is a view in vertical cross-section as taken along the line 2D—2D in FIG. 2B showing the terminal end portion of the memory cell array.
Figure 2E:
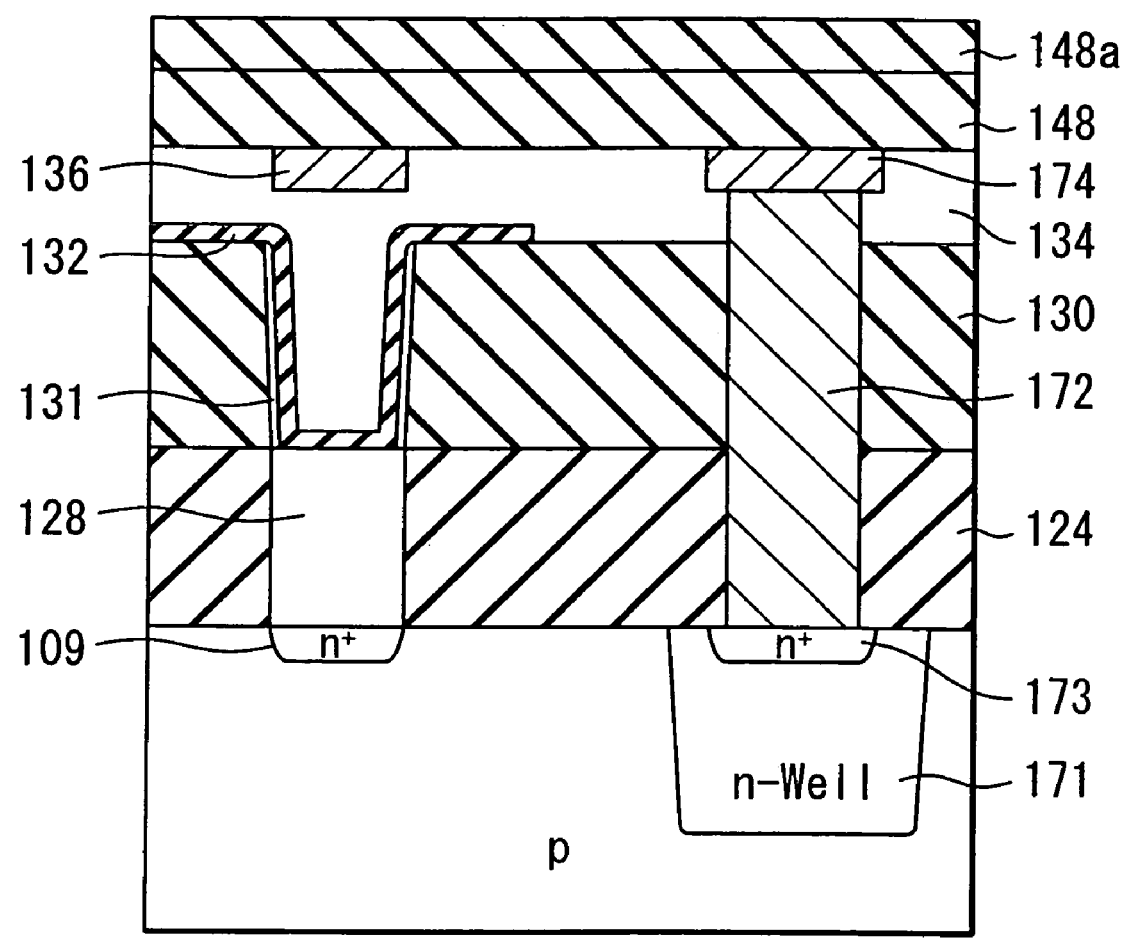
FIG. 2E is a view in vertical cross-section as taken along the line 2E—2E in FIG. 2B.

FIG. 2E is a view in vertical cross-section as taken along the line 2E—2E in FIG. 2B and shows a memory cell terminal end portion as in the case of FIG. 2D. A contact plug 172 of, for example, W is formed between an $n^+$ layer 173 formed in an upper surface of the n well 171 and a Vcc/2 line 174. The $n^+$ layer 109 connected to the n well 171 in FIG. 2D is connected through the contact plug 172 to a Vcc/2 line 174 formed at the upper surface side of the substrate. One bit memory cell in the cell array terminal end portion is formed around a portion between the $n^+$ layer 109 and the bit line 136 on the left side of FIG. 2E.

In FIG. 3, said other of the source and drain of the select transistor Q is connected to one electrode of the capacitor C. The other electrode of the capacitor is connected to the bit line BL to provide a capacitor coupled bit-line cell structure. Even in this structure, there is no operation problem in DRAM as disclosed in '84 ISSCC, Digest of Technical Papers, PP 100 to 101, M. Taguchi et al. "A Capacitance Coupled Bit-Line Cell for Mb Level DRAMs". It is to be noted that the memory cell disclosed in the paper is of an ordinary planar type cell structure.

Now, an explanation will be made below about the manufacturing method of the above-mentioned memory cell.

Figure 4A:
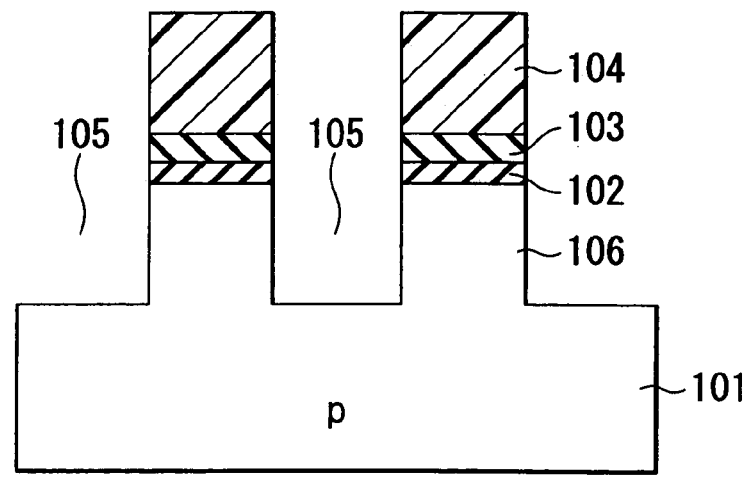
FIGS. 4A and 4B are views for explaining a manufacturing step of a first embodiment, FIG. 4B being a plan view and FIG. 4A showing a vertical cross-section as taken along the line 4A—4A in FIG. 4B.
Figure 4B:
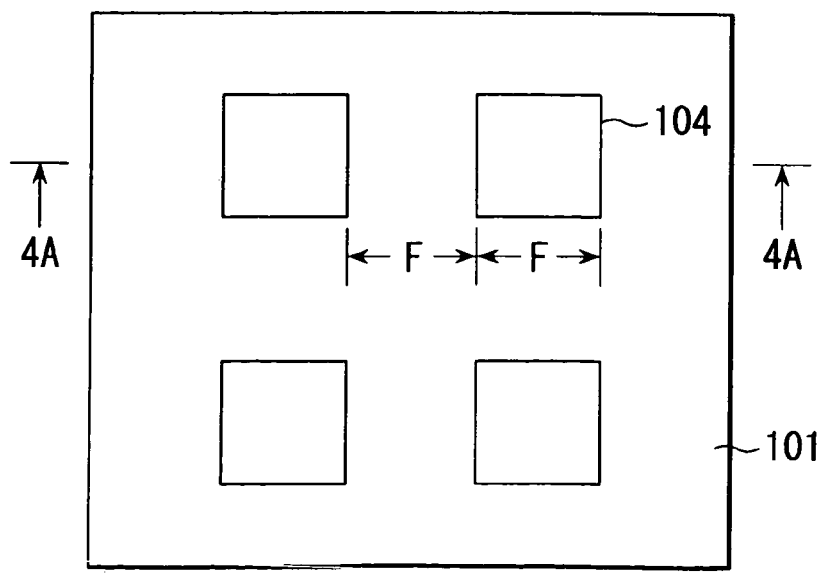

First, as shown in FIG. 4A, an about 10 nm buffer oxide film 102 is formed on the surface of a p type silicon substrate 101 and then an about 200 nm SiN film 103 is deposited on the surface. After the coating of the resist 104 on the film, as shown in FIG. 4B, squares with a minimal work dimension F as one side, each, are formed at intervals of F as a pattern with the use of a patterning process. Using the resist pattern 104 as a mask, the SiN layer 103, silicon oxide film 102 and silicon substrate 101 are sequentially etched to provide a trench 105 in the silicon substrate 101. As a result, a silicon column 106 is provided. At this time, respective trenches 105 are formed in a grid-like array on the silicon substrate and hence a plurality of silicon columns 106 are provided there.

Figure 5:
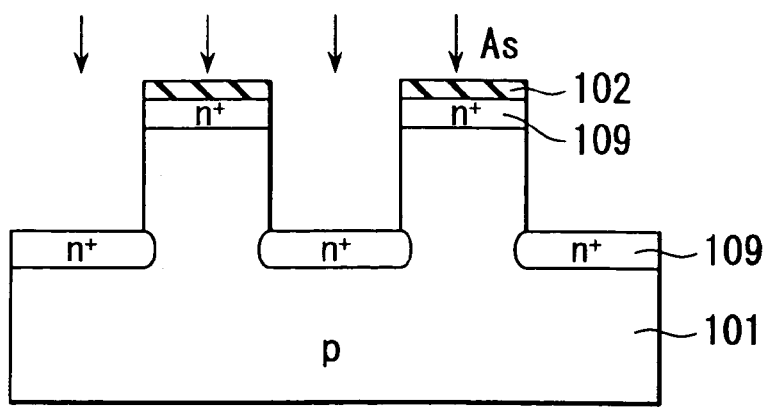
FIGS. 5 to 7 are views in vertical cross-section showing the steps sequentially following that of FIGS. 4A and 4B.

Then, as shown in FIG. 5, the resist 104 and SiN layer 103 are etched away and an As ion is implanted from an upper surface to provide $n^+$ layers 109 each at the bottom of the trench 105 and at the upper portion of the silicon column 106. The $n^+$ layer 109 serves as the source/drain in a vertical type transistor.

Figure 6:
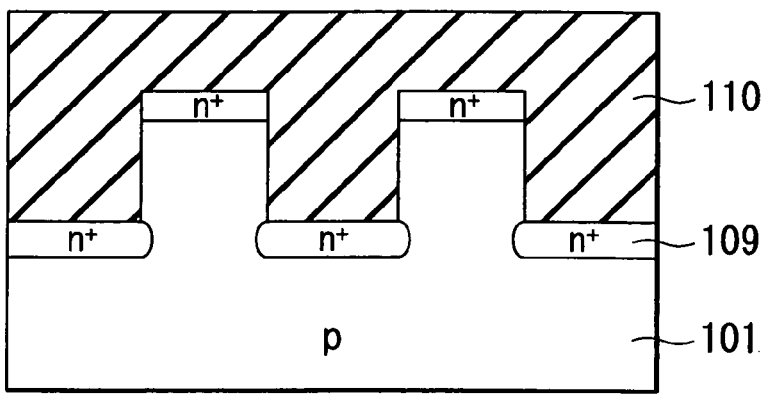
Figure 7:
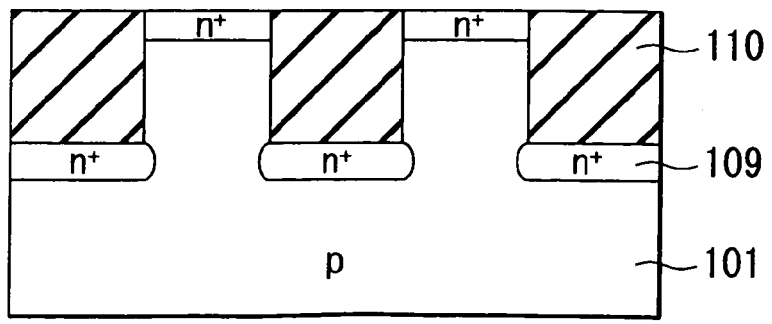

Then, as shown in FIG. 6, a silicon oxide film is deposited on a whole surface to provide a silicon oxide layer 110 and the trench 105 is buried with the silicon oxide film. Then the silicon oxide film layer 110 is polished, by a chemical mechanical polishing (CMP) method, down to the upper surface of the silicon column 109 and the upper surface is planarized (FIG. 7). As a result, the trench 105 is buried with the silicon oxide film to provide a shallow trench isolation (STI) 110.

Figure 8A:
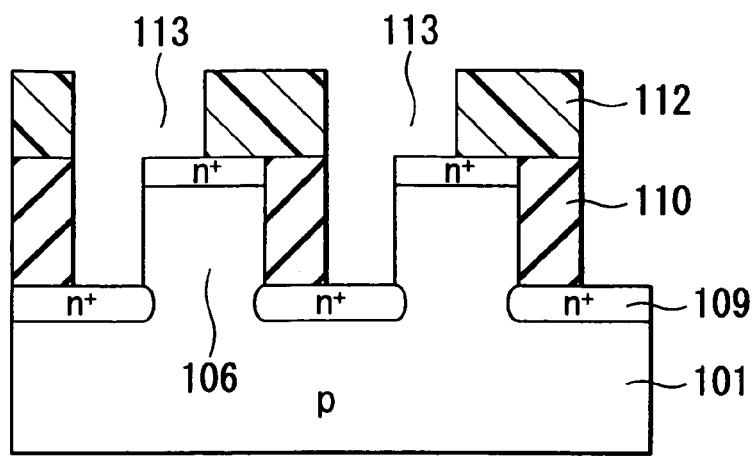
FIGS. 8A and 8B are views showing the step following that of FIG. 7, FIG. 8B being a plan view and FIG. 8A showing a cross-section as taken along the line 8A—8A in FIG. 8B.

Then, as shown in FIG. 8, a resist 112 is formed in a manner to have an overlap of (½) F in one direction (a lateral direction in Figure) of the silicon column 106. Reference numeral 113 show a resist opening. With this resist 112 used as a mask, as shown in FIG. 8A, one half of the STI oxide film 110 is etched away to expose one side surface of the silicon column 106. By doing so, a channel region of a vertical type transistor is formed at the side surface of the exposed silicon column.

Figure 8B:
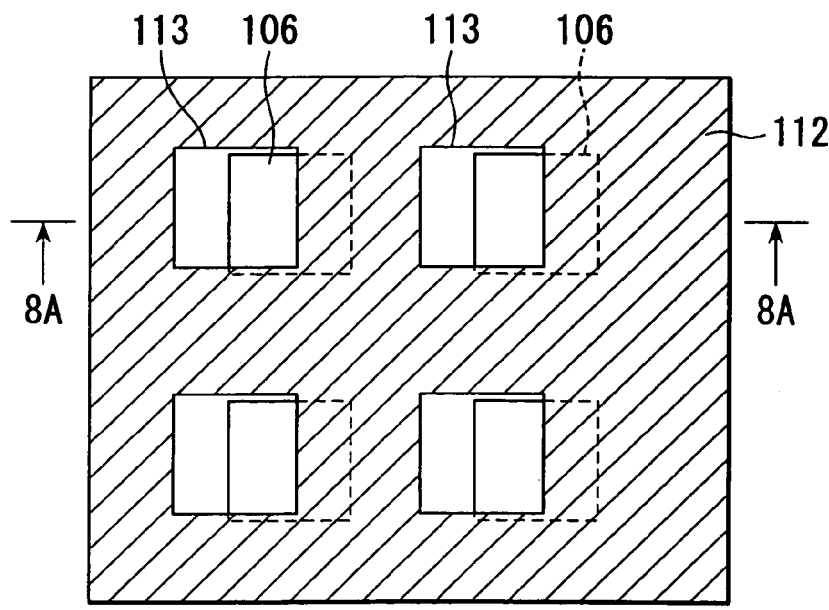

Although, in the upper surface view of FIG. 8B, the silicon column 106 and resist 112 are shown as being somewhat displaced in a vertical direction, in actuality, the somewhat displaced line is aligned and this is so shown for easiness in understanding. In those following upper surface views, the same consideration is also paid for better understanding.

Figure 9:
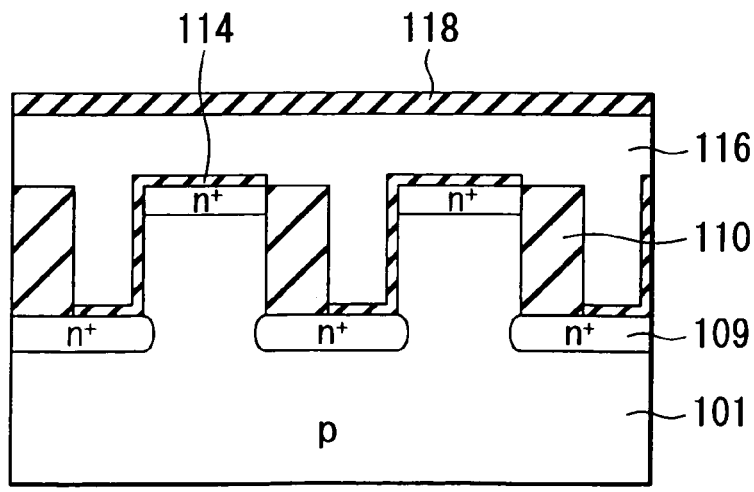
FIG. 9 is a view in vertical cross-section showing a step sequentially following the step of FIGS. 8A and 8B.

Then, as shown in FIG. 9, after the removal of the resist 112, a gate oxide film 114 is formed on the exposed surfaced of the silicon substrate 101. At this time, the gate oxide film 114 is formed on the exposed upper surface and exposed side surface of the silicon column 106 and on the exposed bottom surface of the trench. At this time, the silicon oxide film on the side surface of the silicon column has an optimal thickness as a gate oxide film and the thickness of the silicon oxide film on the upper surface of the silicon column and on the bottom surface of the trench may be made equal to or greater than that on the side surface of the silicon column, for example, two times as great as that on the side surface of the silicon column. The silicon oxide film on the upper surface and on the bottom surface may be added by deposition.

Subsequently, a polysilicon layer 116 serving as a gate electrode is deposited on a whole surface. In order to lower the resistance of the polysilicon, silicide such as WSi and metal may be deposited on the polysilicon layer. An SiN layer 118 is deposited on the polysilicon layer 116 to enable a self-alignment to be achieved between the gate electrode and a storage node contact to be later formed.

Figure 10A:
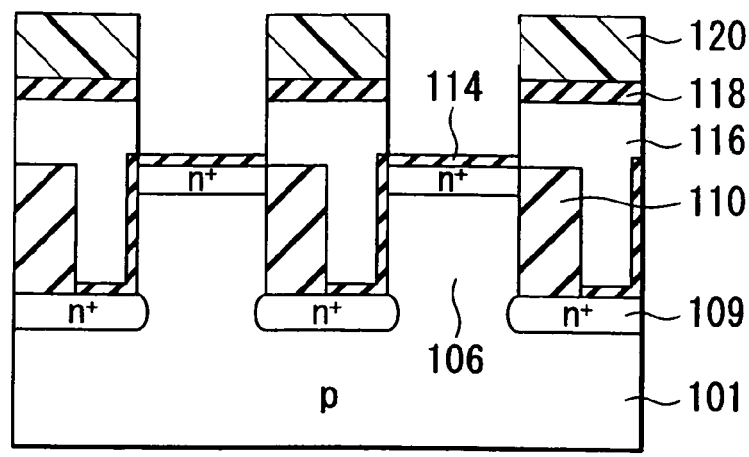
FIGS. 10A and 10B are views showing the step following that of FIG. 9, FIG. 10B being a plan view and FIG. 10A showing a cross-section as taken along the line 10A—10A in FIG. 10B.
Figure 10B:
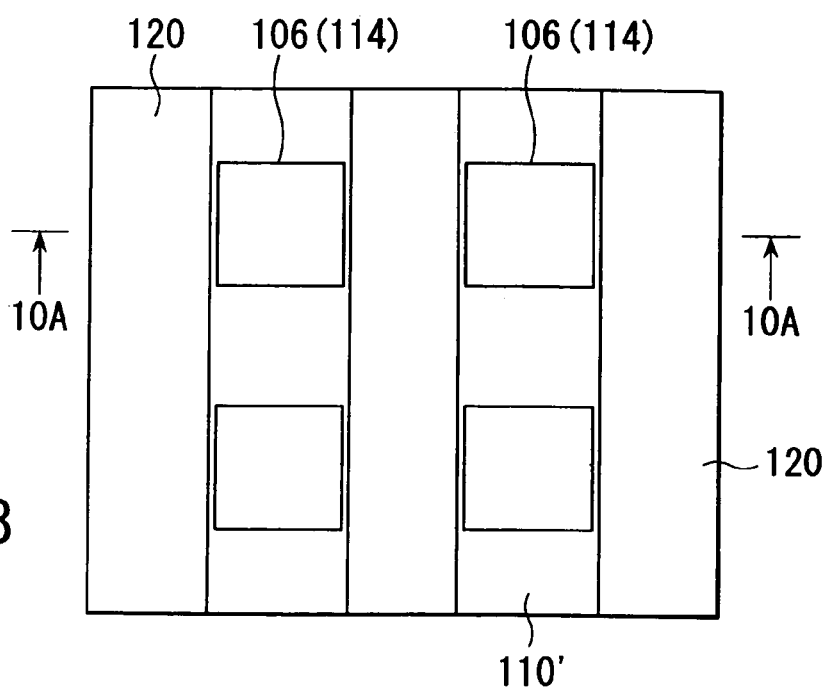

Then a gate acting as a word line is patterned. As shown in FIG. 10B, the resist 120 is patterned so as to have the word line run in an up/down direction at a lateral space between the silicon columns and, with this used as a mask, the SiN layer 118 and polysilicon layer 116 are sequentially etched by a reactive ion etching (RIE) technique to remove them.

Figure 11:
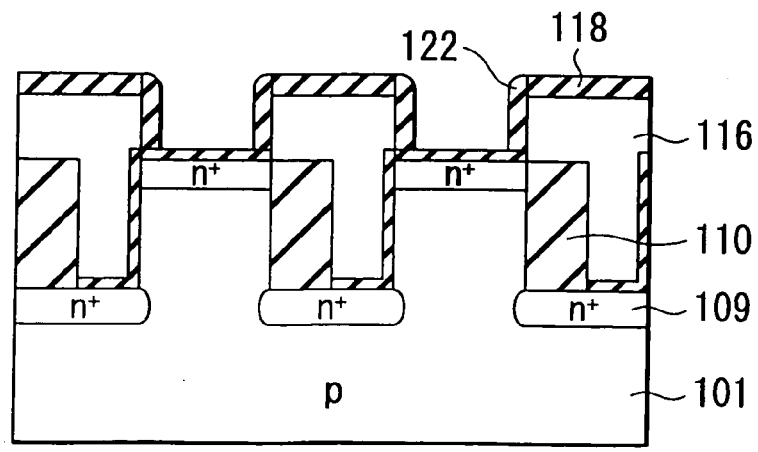
FIGS. 11 to 14 are cross-sectional views showing the steps following the step of FIG. 10A and 10B.

After this, an SiN is deposited and it is etched away by the RIE process and the exposed side surface of the gate electrode 116 can be covered with an SiN film 122 (FIG. 11). This completes the process of the gate electrode and, by the process of FIGS. 9 to 11, it is possible to form not only a transistor of a memory cell area but also a transistor in a peripheral circuit area (not shown) at the same time.

Figure 12:
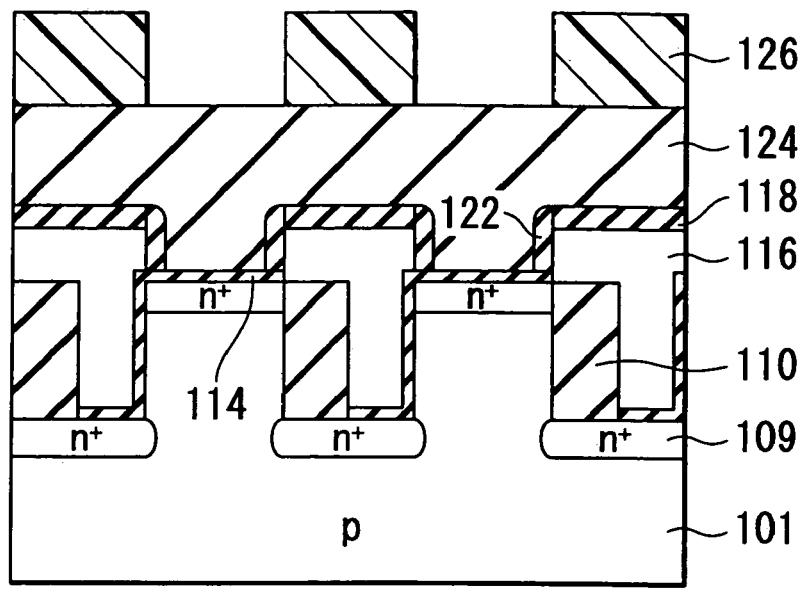

Then, as shown in FIG. 12, in order to planarize a space groove between the word lines, a silicon oxide film 124 is deposited, followed by a planarization step by the CMP method. After this, a resist 126 is coated and patterning is done to open a hole at the same position corresponding to the silicon column.

Then, with the resist 126 used as a mask, a silicon oxide film 124 and silicon oxide film 114 on the $n^+$ diffusion layer 109 are etched away by the RIE method to form a storage node contact hole, in a self-aligned fashion, at the upper side of the gate electrode 116.

Figure 13:
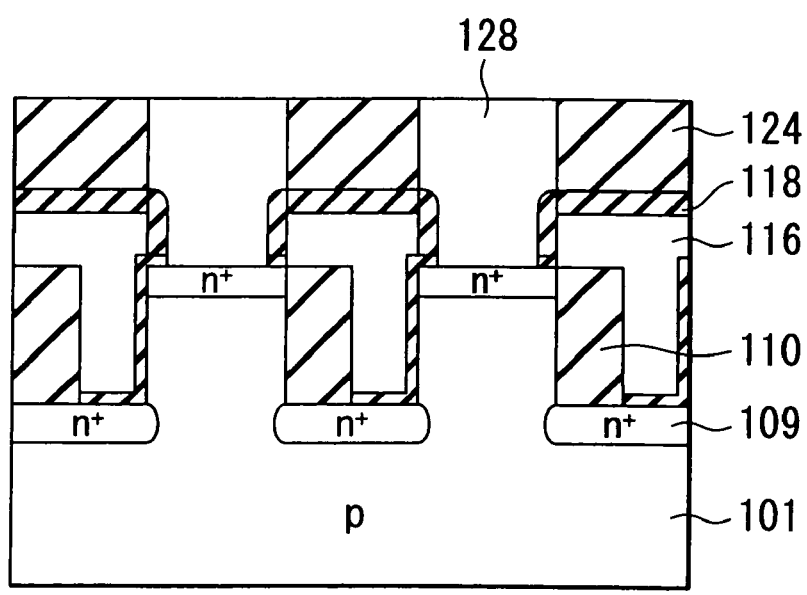

Then, as shown in FIG. 13, a conductive material such as an As-doped polysilicon is buried into a contact hole and this is planarized. By doing so, the conductive material is buried in the contact hole and, at the same time, a storage node contact plug 128 can be formed, at a self-aligned fashion, relative to a head area (word line) of the gate electrode 116.

Figure 14:
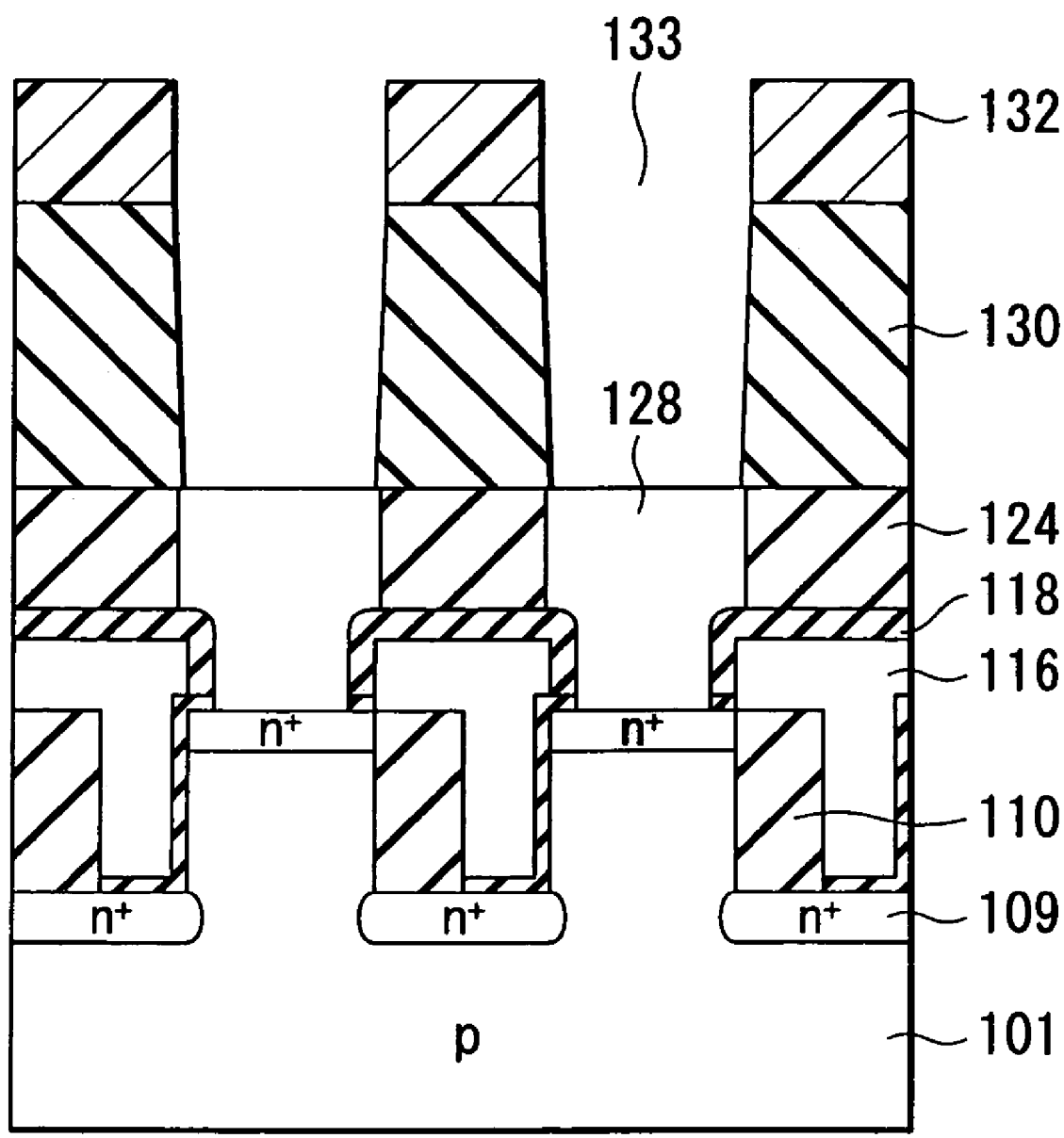

Then, as shown in FIG. 14, an about 1 μm silicon oxide film 130 is deposited and a silicon oxide film 130 overlying the contact plug 128 is etched by the RIE method to provide an opening (hole) for capacitor formation. The thickness of the silicon oxide film depends upon a required capacitance of a capacitor. In order to obtain a larger capacitance it is necessary that the height of the storage node electrode be raised as will be set out later.

Figure 15A:
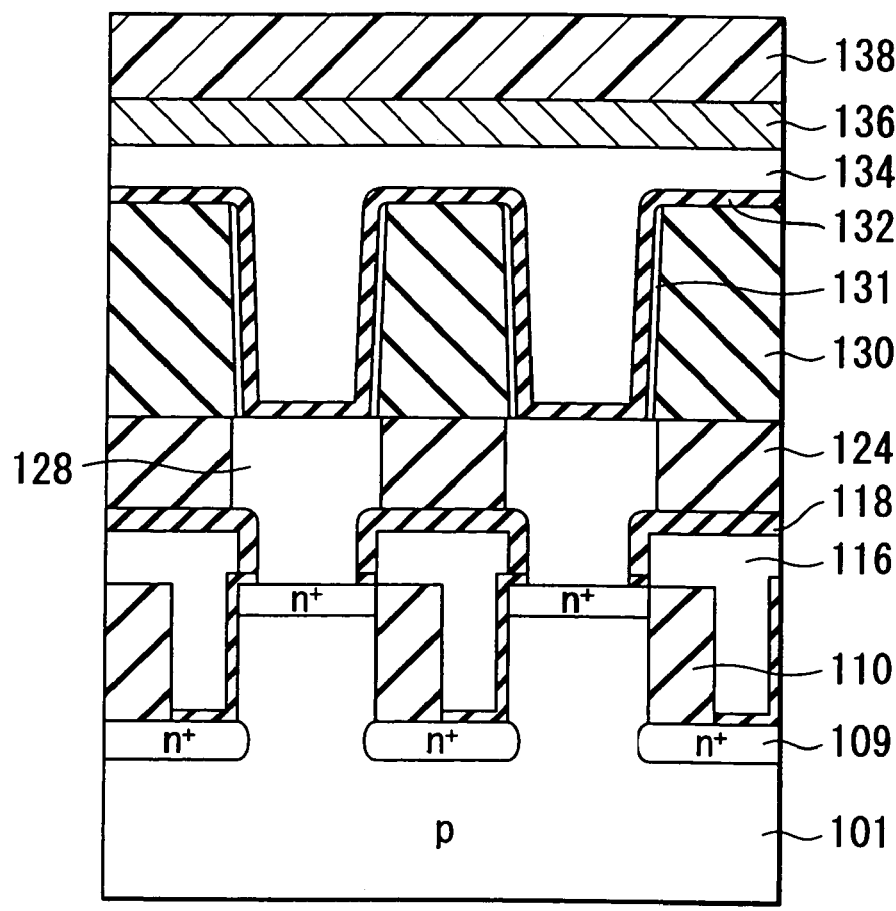
FIGS. 15A and 15B are views showing the step following that of FIG. 14, FIG. 15B being a plan view and FIG. 15A showing a cross-section as taken along the line 15A—15A in FIG. 15B.

Then, as shown in FIG. 15A, an As-doped polysilicon is so deposited as to thinly cover the side surface of the hole 133 and, by etching it by the RIE method, the polysilicon 131 is left only on the side surface of the hole 133. Then, a high dielectric insulating film 132 of, for example, BST, SiN or $Ta_2O_5$ is deposited on a whole wafer surface and, then, an impurity-doped polysilicon 134, W or another metal 136 is deposited so as to form an electrode commonly used as a plate electrode and bit line electrode. After this, the deposited layer 136 is patterned to extend in a direction orthogonal to the word line over a space between the silicon columns 106.

Then, the process goes to a final configuration formation step shown in FIG. 2. First, the silicon oxide film is deposited to provide an interlayer insulator 148 and, after a planarization step by the CMP method, a bit line contact, etc., is patterned and a contact is opened by the RIE method. After this, aluminum is deposited and patterned to provide an Al connection line.

By the above-mentioned process, a memory cell of an occupation area $4F^2$ is completed.

Second Embodiment

Figure 16A:
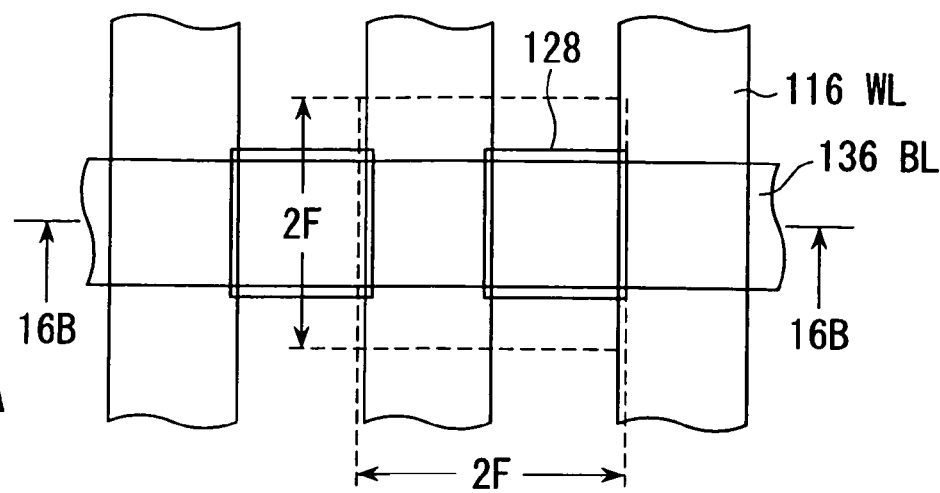
FIGS. 16A and 16B are views for explaining a manufacturing step of a memory cell according to a second embodiment, FIG. 16A being a plan view and FIG. 16B showing a cross-section as taken along the line 16B—16B in FIG. 16A.
Figure 16B:
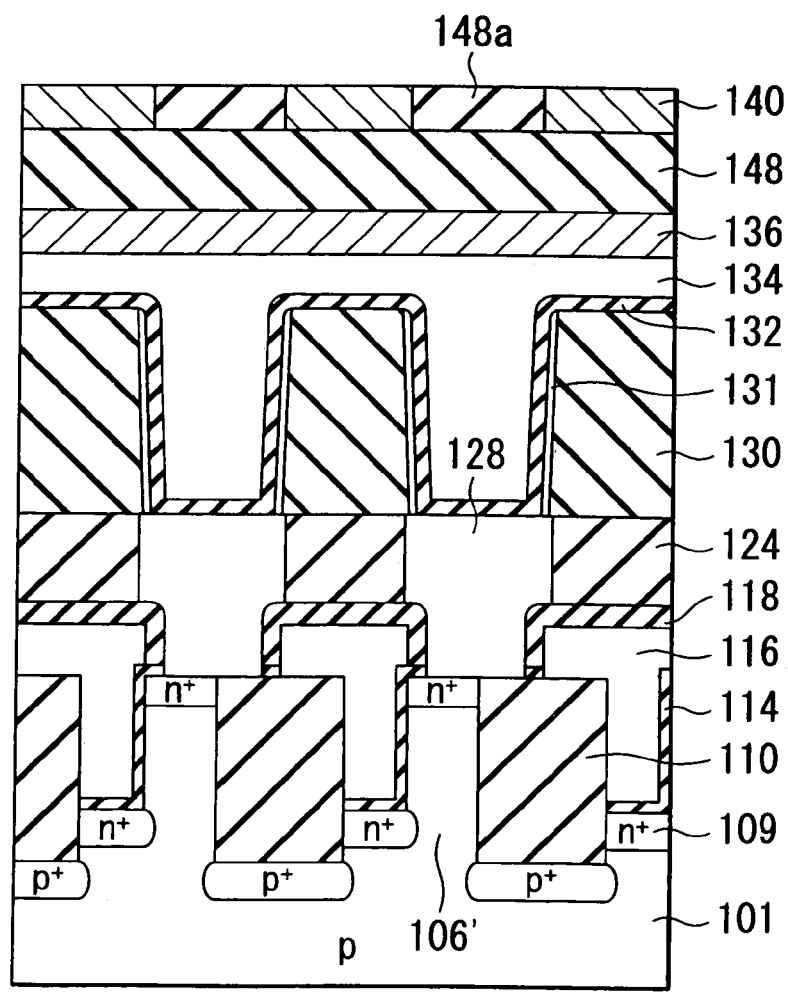

FIGS. 16A and 16B are a planar layout diagram, and a cross-sectional view, showing a memory cell as a model according to a second embodiment of the present invention. The memory cell of the second embodiment has a configuration of an occupation area $4F^2$ also and is comprised of a capacitor coupled bit-line cell structure. This configuration is different from that of the first embodiment in respect of the source/drain dimension of its vertical type transistor and its manufacturing method. Now an explanation will be made below about the manufacturing method. For easiness in understanding of this embodiment, the same reference numerals are employed to designate the same portions or areas corresponding to those shown in the first embodiment.

Figure 17:
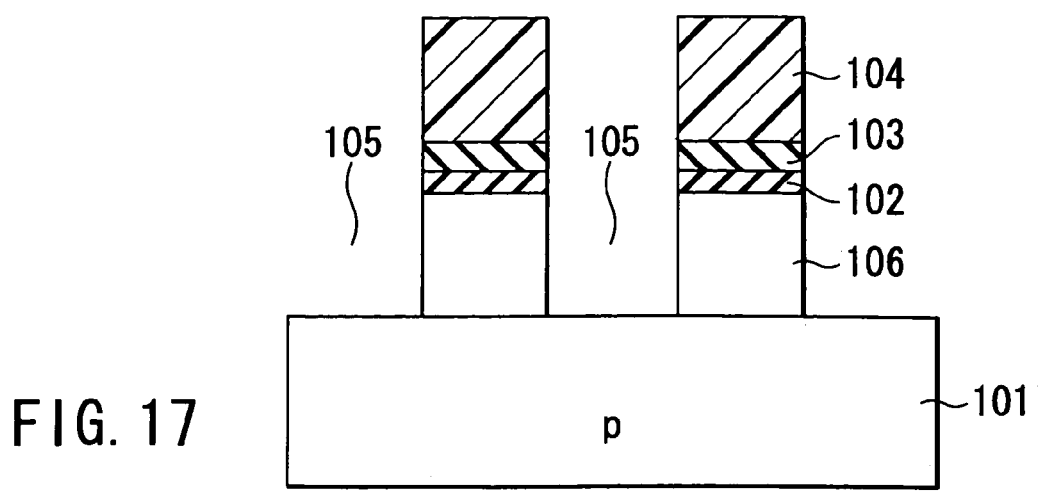
FIGS. 17 to 19 are views in vertical cross-section showing the steps sequentially following the step of FIGS. 16A and 16B.

First, a silicon column 106 as shown in FIG. 17 is formed in the same way as the first embodiment of FIG. 4A. That is, after an about 10 nm buffer oxide film 102 has been formed on the surface of a p type silicon substrate 101, an about 200 nm SiN film 103 is deposited on a resultant surface and a resist 104 is coated on a resultant surface. As in the case of FIG. 4B, squares with a minimal work dimension F are formed, by patterning, at intervals of a minimal work dimension F with the use of the lithography technique.

Figure 18:
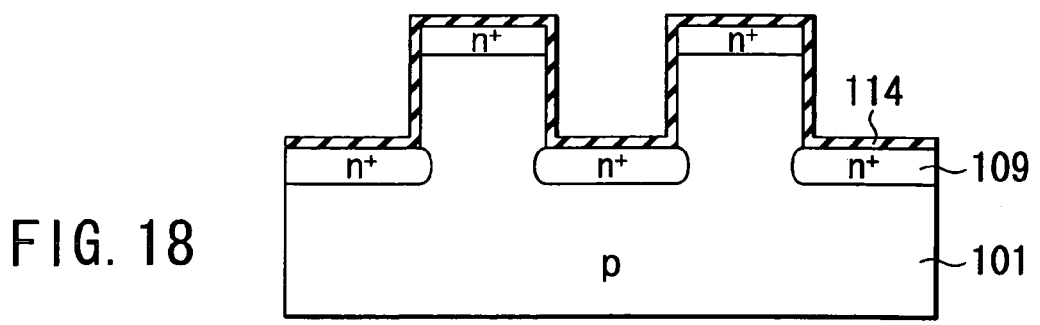

Then, as shown in FIG. 18, the resist 104 and SiN layer 103 are etched away and, after the implantation of an As ion, an $n^+$ layer 109 serving as the source/drain of a vertical type transistor is formed at the trench bottom and at the upper side of a silicon column. After this, the buffer oxide film 102 is etched away with an HF solution and a gate oxide film 114 is formed on the surface. It is desirable that, as in the case of the first embodiment, the gate oxide film 114 be made thicker on the upper surface of the silicon column 106 and on the bottom surface of a trench.

Figure 19:
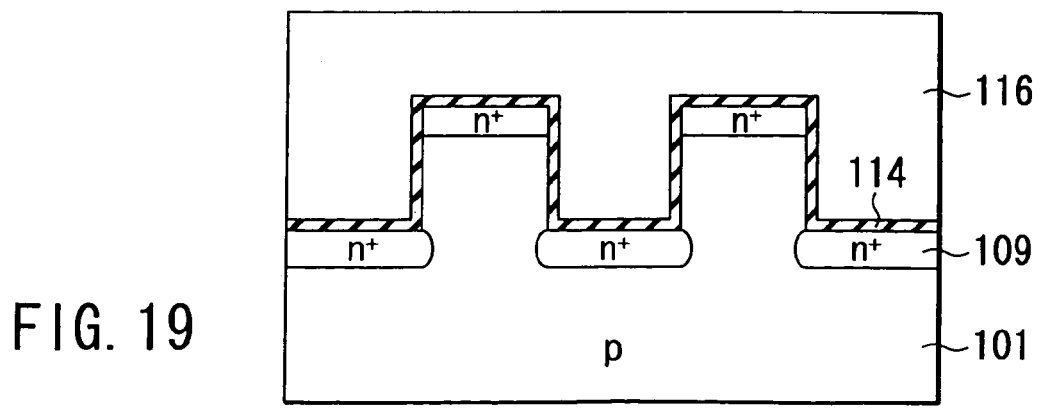

Then, as shown in FIG. 19, a polysilicon layer 116 is deposited on the whole surface to bury the trench with it and is planarized to an uppermost surface of the oxide film 114 on the upper surface of the silicon column 106 with the use of the CMP method.

Figure 20A:
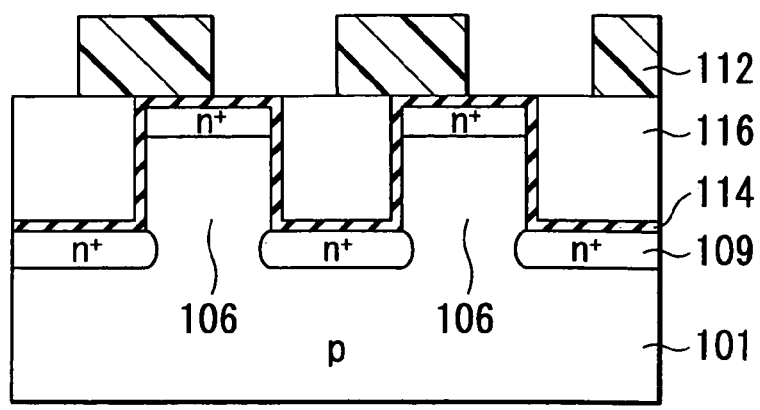
FIGS. 20A and 20B are views showing the step following that of FIG. 19, FIG. 20B being a plan view and FIG. 20A showing a cross-section as taken along the line 20A—20A in FIG. 20B.
Figure 20B:
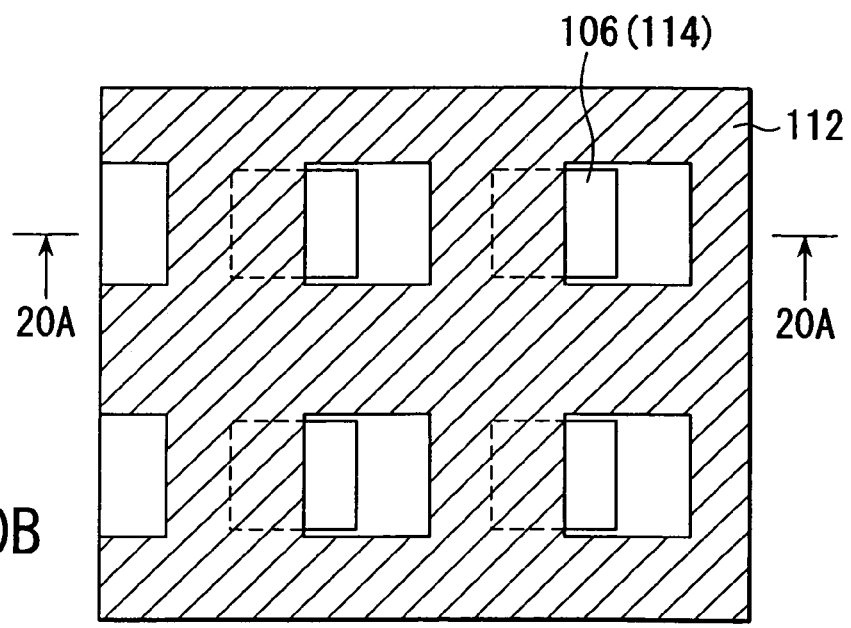

Then, as shown in FIGS. 20A and 20B, a resist pattern having a square opening with one side F is formed in a manner to have a (½) F overlap relative to the silicon column 106 and, with this used as a mask, one half of the silicon column 106 and exposed portion at the mask opening of the buried polysilicon 116 are etched away.

Figure 21:
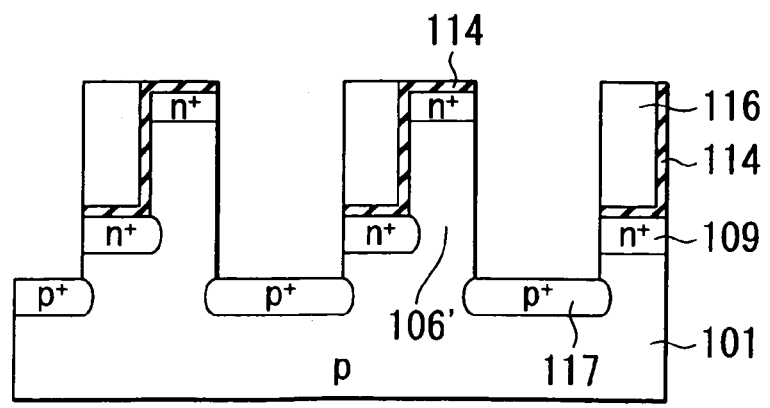
FIGS. 21 and 22 are views in vertical cross-section showing the steps following that of FIGS. 20A and 20B.

Then, as shown in FIG. 21, in order to enhance the element isolation withstand voltage, a boron ion is implanted into the trench bottom portion to provide a $P^+$ layer 117. It is to be noted that the silicon column 106, being halved by a previous work process, is represented by 106'.

Figure 22:
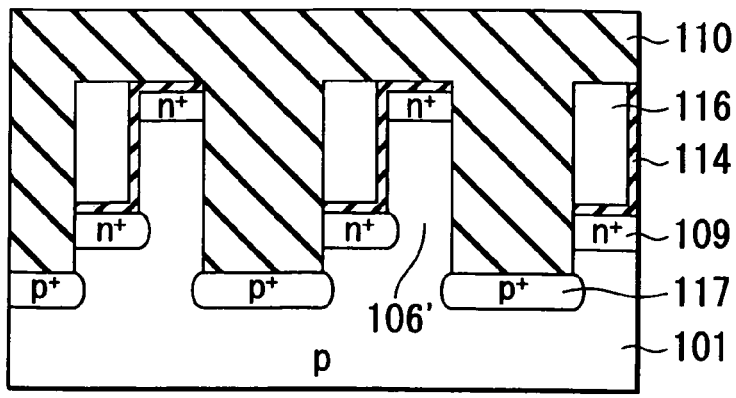
Figure 23A:
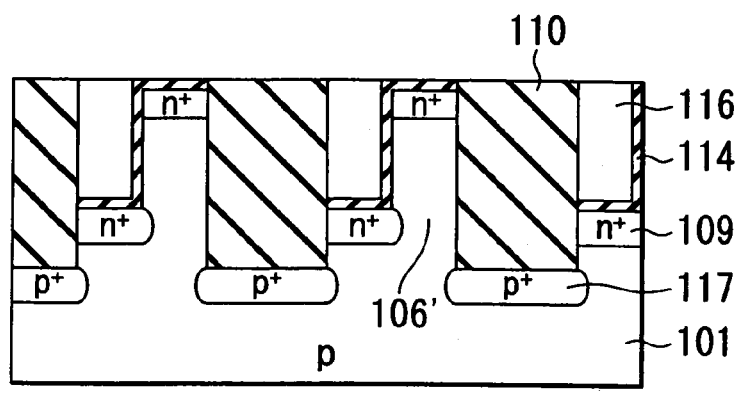
FIGS. 23A and 23B are views showing the step following that of FIG. 22, FIG. 23B being a plan view and FIG. 23A showing a cross-section as taken along the line 23A—23A in FIG. 23B.
Figure 23B:
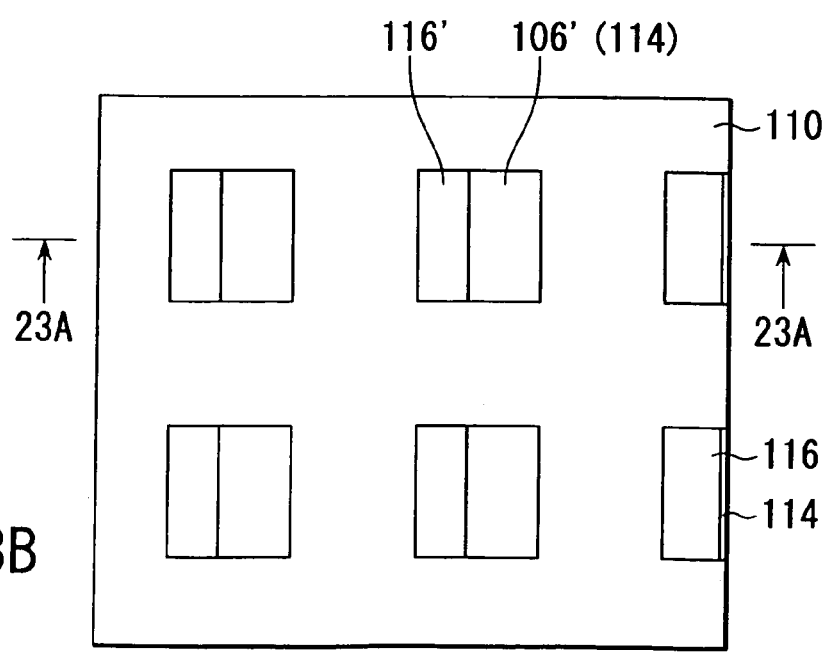

Then, as shown in FIG. 22, a silicon oxide film 110 is deposited on the whole surface and planarized, by the CMP method, to the upper surface of the oxide film 114 on the silicon column 106'. A resultant structure is as shown in FIGS. 23A and 23B.

Figure 24A:
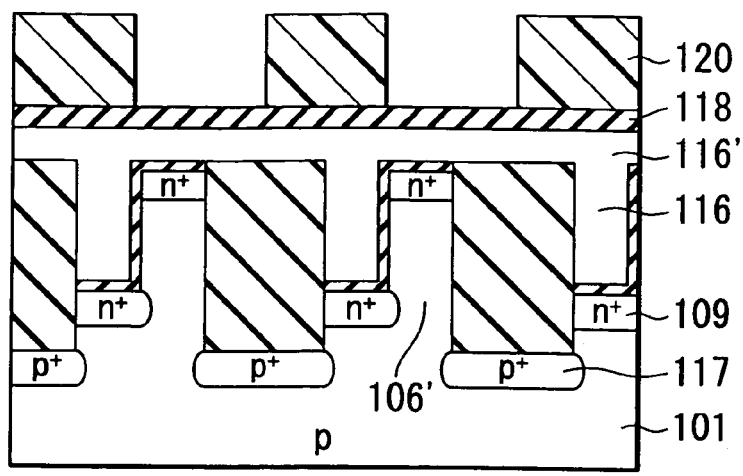
FIGS. 24A and 24B are views showing the step following that of FIGS. 23A and 23B, FIG. 24B being a plan view and FIG. 24A showing a cross-section as taken along the line 24A—24A in FIG. 24B.
Figure 24B:
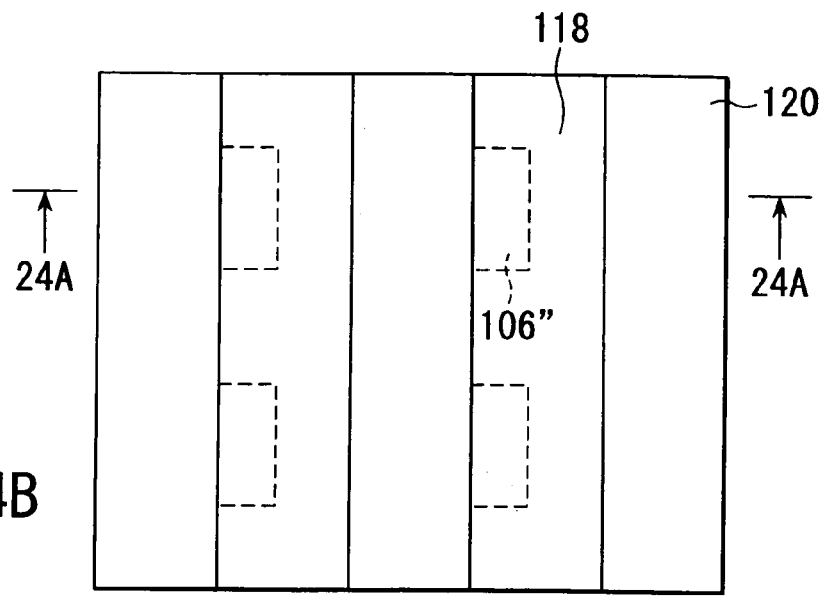

Then, as shown in FIG. 24, a polysilicon 116' and SiN 118 are sequentially deposited and a gate serving as a word line is patterned. In order to make the word line lower in resistance, it may be possible to deposit WSi or metal material between the polysilicon 116' and the SiN 118. In order to have the word line run in an up/down direction (in the Figure) in a space between the silicon columns, a resist 120 is patterned and, with this used as a mask, the SiN film 118, (WSi) and polysilicon 116' are sequentially etched away by the RIE process. By doing so, the polysilicon 116' is work-processed as a word line but it is made as an integral unit to the gate 116 and, as will be set out below, the word line and gate together are represented by 116.

Figure 25:
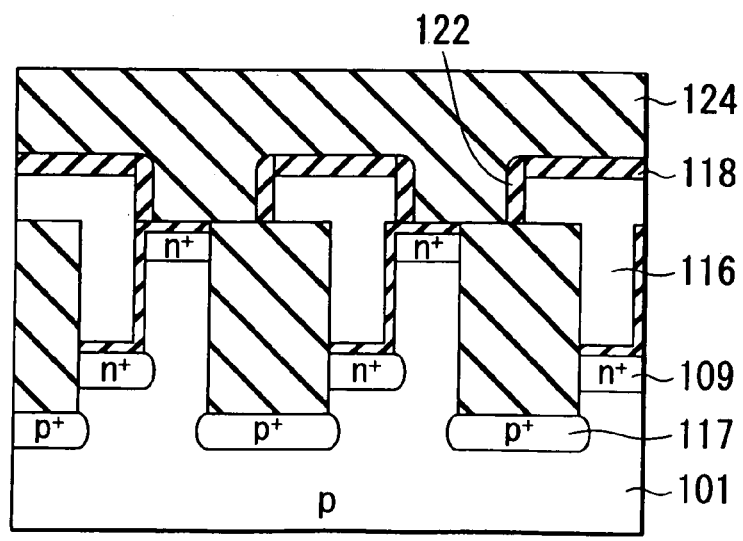
FIG. 25 is a view in vertical cross-section showing the step following that of FIGS. 24A and 24B.

After the removal of the resist 120, SiN is deposited and etched by the RIE method and, as shown in FIG. 25, the SiN 122 can cover an exposed side surface of the word line 116. By doing so, the work process of the gate electrode is completed. In this case, however, not only the memory cell area but also the transistor in the peripheral circuit can be formed at the same time.

After this, a silicon oxide film 124 is deposited on the whole surface so as to form a storage node contact and is planarized by the CMP method. A sequential process is the same as that of the first embodiment as shown in FIG. 12 et seq.

By the above manufacturing process it is possible to form a 4F² type memory cell as in the case of the first embodiment.

Third Embodiment

Figure 1A:
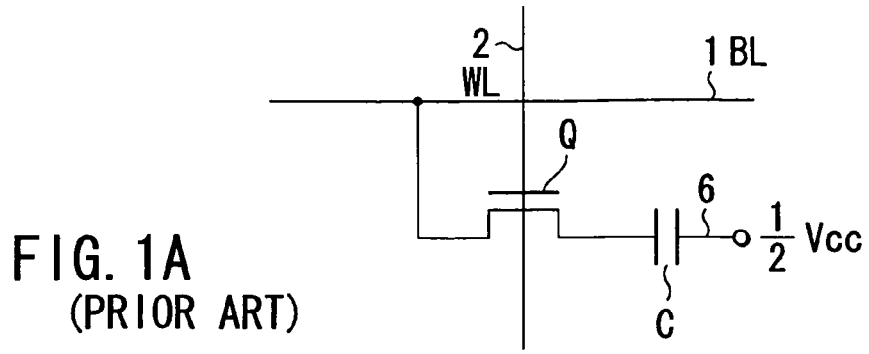
FIG. 1A shows an equivalent circuit diagram of a conventional memory cell.
Figure 1B:
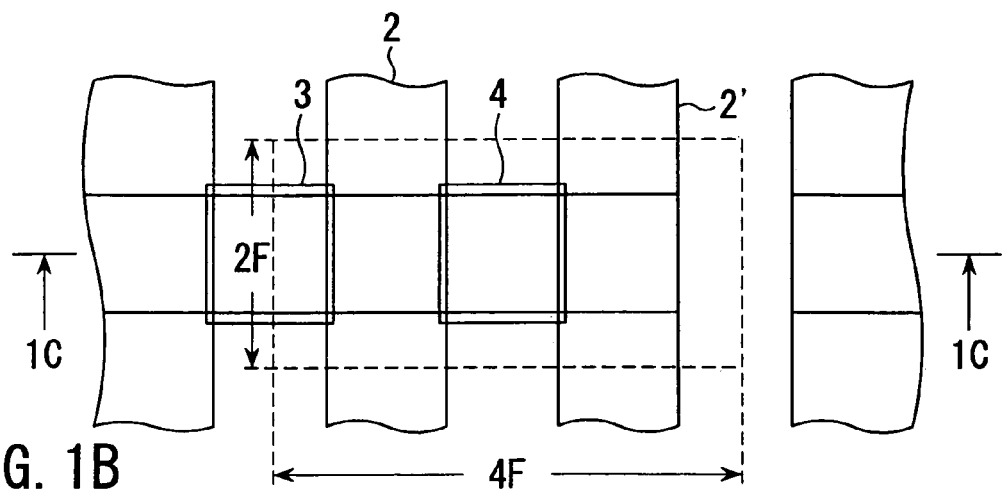
FIG. 1B shows a planar layout diagram of a conventional memory cell.
Figure 1C:
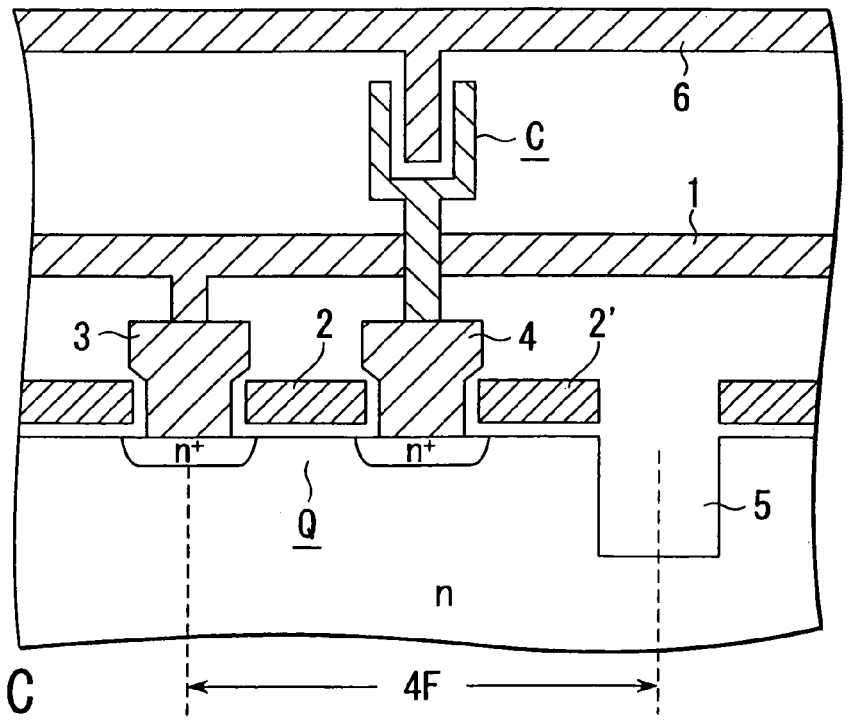
FIG. 1C is a view in vertical cross-section as taken along the line 1C—1C in FIG. 1B.

A memory cell of the third embodiment has the same equivalent circuit as that of the prior art shown in FIG. 1A and is of such a type that a constant voltage is applied to the plate electrode of a capacitor. In this case, however, a so-called surrounding gate type vertical transistor is used where the side surfaces of the silicon column are all surrounded with a gate electrode and a bit line formed at the upper side of the silicon column is connected to a trench bottom through a plug.

Figure 26A:
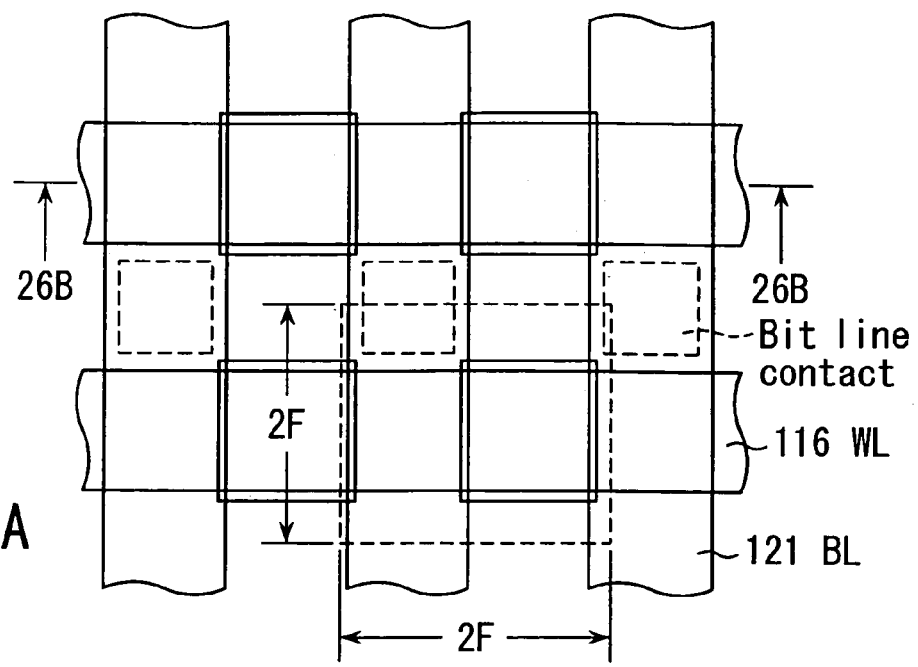
FIGS. 26A and 26B are a view for explaining the manufacturing steps of a memory cell according to a third embodiment, FIG. 26A being a plan view and FIG. 26B showing a cross-section as taken along the line 26B—26B in FIG. 26A.
Figure 26B:
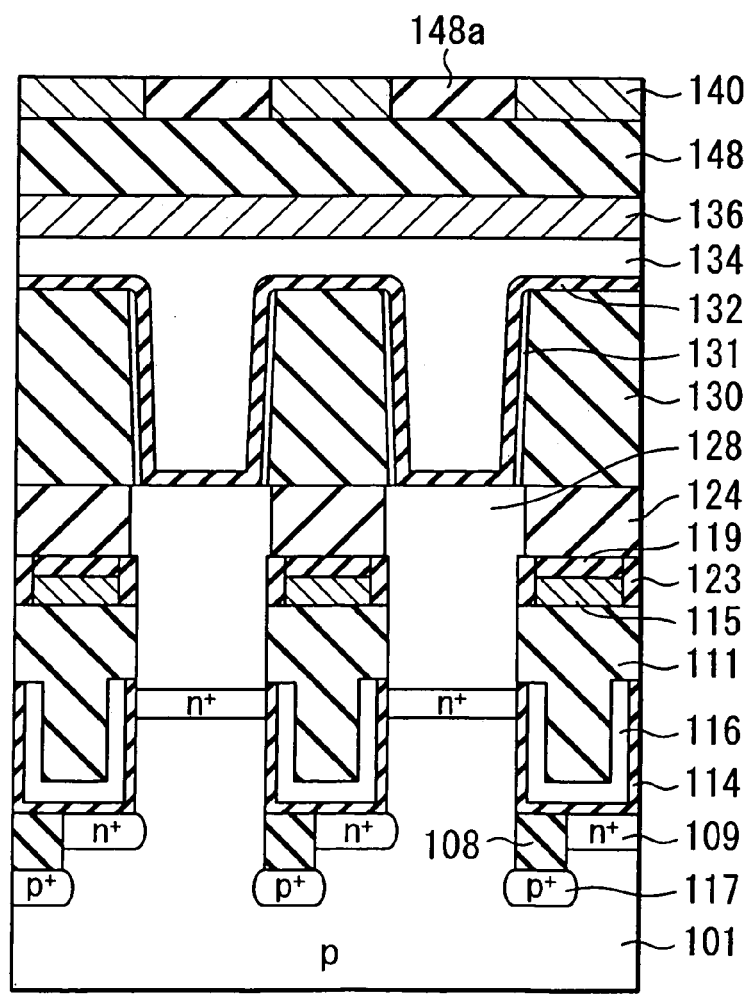

FIGS. 26A and 26B are a planar layout diagram, and a cross-sectional view, of a memory cell according to the third embodiment of the present invention. Even if this structure is adopted, it is possible to realize a memory cell of an occupation area 4F². An explanation will be made about the manufacturing process of this memory cell. For ease in understanding of the embodiments, the same reference numerals are employed to designate portions or areas corresponding to those shown in the first embodiment.

Figure 27:
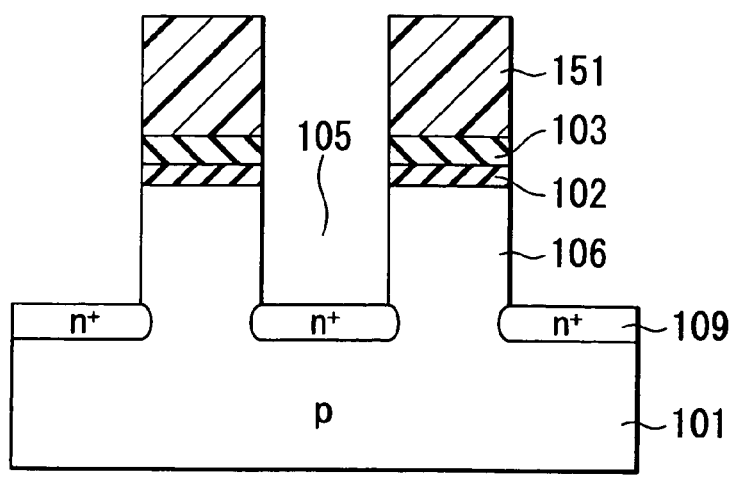
FIG. 27 is a view in vertical cross-section showing the step following that of FIGS. 26A and 26B.

First, a silicon column 106 as shown in FIG. 27 is formed in the same way as in the first embodiment shown in FIG. 4A. That is, an about 10 nm buffer oxide film 102 is formed on the surface of a p type silicon substrate 101 and an about 200 nm SiN film 103 is deposited, followed by the coating of a resist 151 on a surface of the SiN film 103. As in the case of FIG. 4B, squares with a minimal work dimension F are formed at intervals of the dimension F with the use of a patterning process using the lithography technique. Then, an SiN film 102, buffer oxide film 103 and surface portion of a silicon substrate 101 are sequentially etched away to provide a silicon trench 105. After the etching of the resist 151, an As ion is implanted to provide an n⁺ layer 109 at a trench bottom which serves as a source/drain of the vertical type transistor.

Figure 28A:
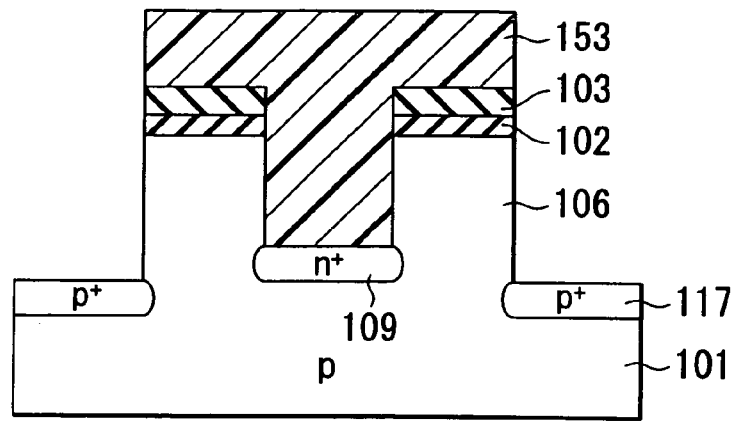
FIGS. 28A and 28B are views showing the step following that of FIG. 27, FIG. 28B being a plan view and FIG. 28A showing a cross-section as taken along the line 28A—28A in FIG. 28B.
Figure 28B:
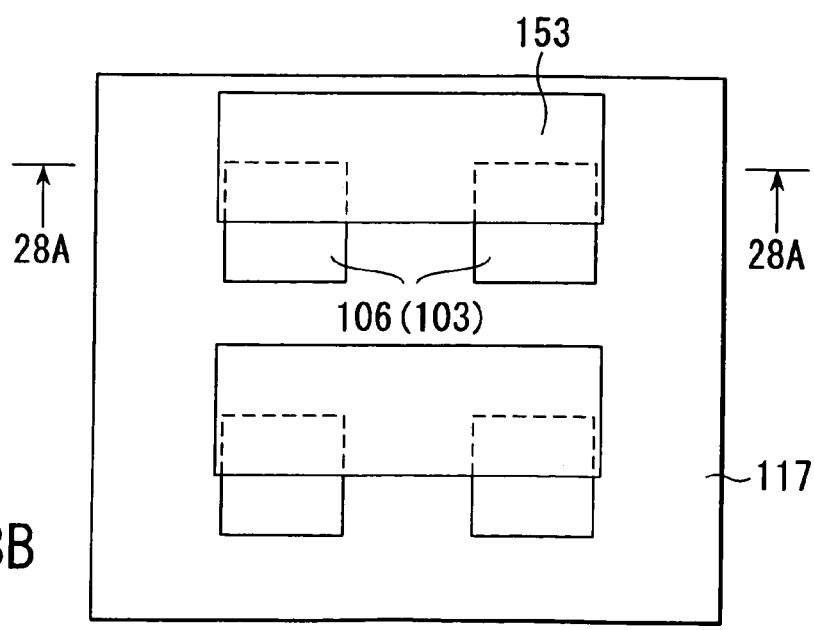

Then, as shown in FIG. 28B, a resist 153 is formed in a one-half overlapped relation to laterally adjacent two silicon columns and, with this used as a mask, the surface of the silicon substrate 101 is etched to a depth at which it is possible to remove an n⁺ diffusion layer 109 at a trench bottom not covered with the resist 153. After this, a boron ion is implanted to form a p⁺ diffusion layer 117 at an exposed trench bottom for achieving an element isolation. Then the resist 153, SiN layer 103 and buffer oxide film 102 are removed.

It is to be noted that, in FIG. 28B, with the resist 153 used as a mask, an n⁺ diffusion layer 109 is left at a trench bottom and serves as a source/drain layer (impurity layer) shared between those adjacent memory cells.

Figure 29:
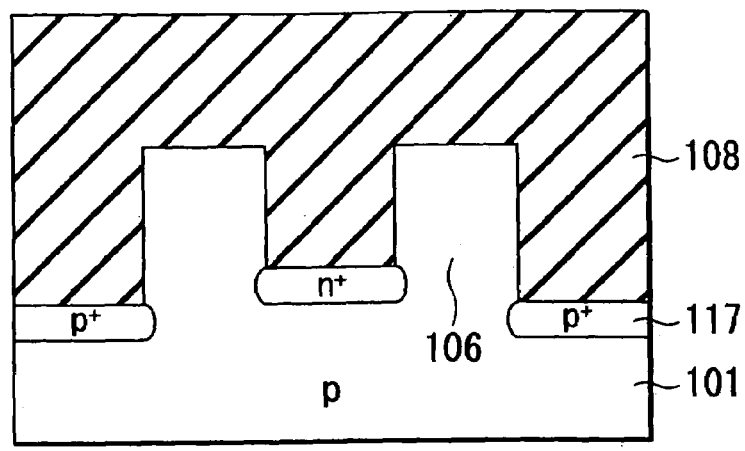
FIG. 29 is a view in vertical cross-section showing the step following that of FIGS. 28A and 28B.
Figure 30A:
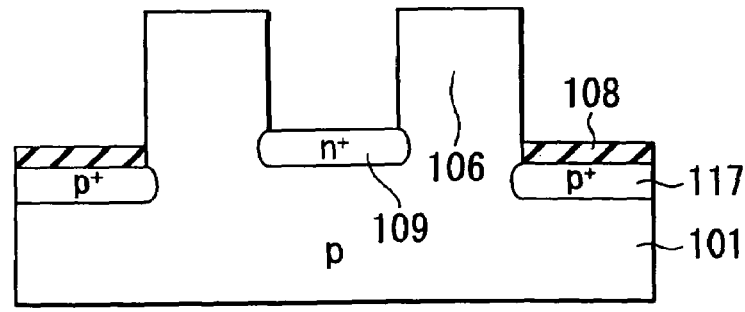
FIGS. 30A and 30B are views showing the step following that of FIG. 29, FIG. 30B being a plan view and FIG. 30A showing a cross-section as taken along the line 30A—30A in FIG. 30B.
Figure 30B:
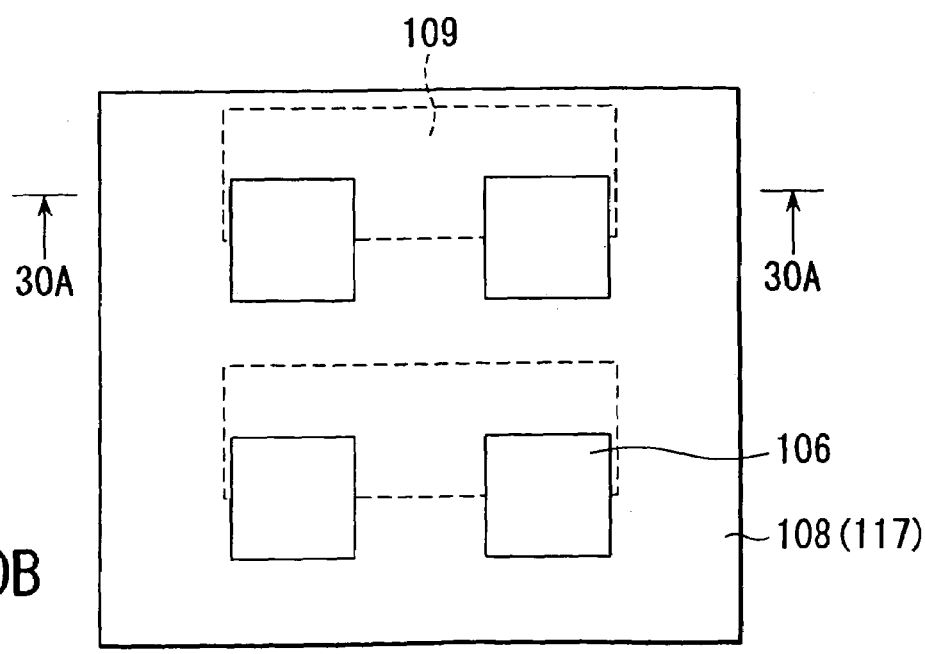

Then, as shown in FIG. 29, a silicon oxide film 108 is deposited on a whole surface and then its upper portion is etched back by the CMP method to bury an associated trench with a silicon oxide film 108. Further, as shown in FIGS. 30A and 30B, the silicon oxide film 108 is further etched back by the RIE process to leave the silicon oxide film 108 at the associated trench bottom only. This state as viewed in a planar state is shown in FIG. 30B.

Figure 31:
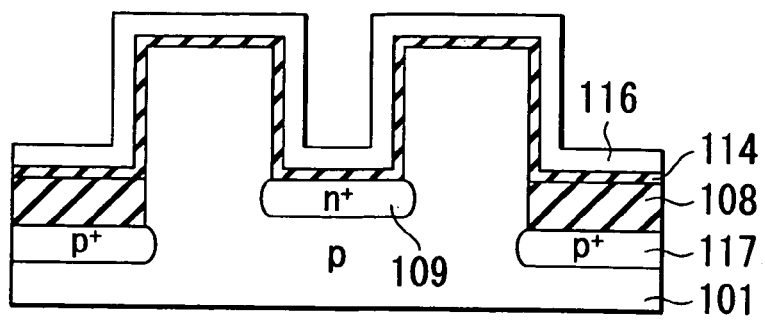
FIG. 31 is a view in vertical cross-section showing the step following that of FIGS. 30A and 30B.

Then, a native oxide film on the side and upper surfaces of the silicon column is removed to expose the silicon surface and a gate insulating film 114 is formed as shown in FIG. 31. Then a polysilicon film 116 serving as a gate electrode is deposited on the whole surface.

Figure 32A:
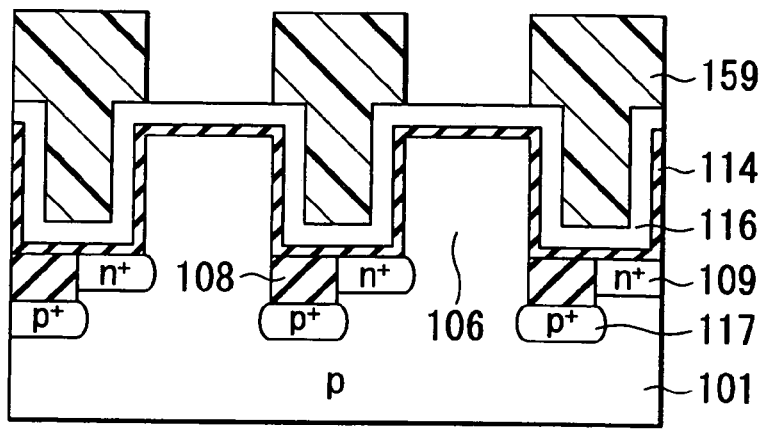
FIGS. 32A and 32B are views showing the step following that of FIG. 31, FIG. 32B being a plan view and FIG. 32A showing a cross-section as taken along the line 32A—32A in FIG. 32B.
Figure 32B:
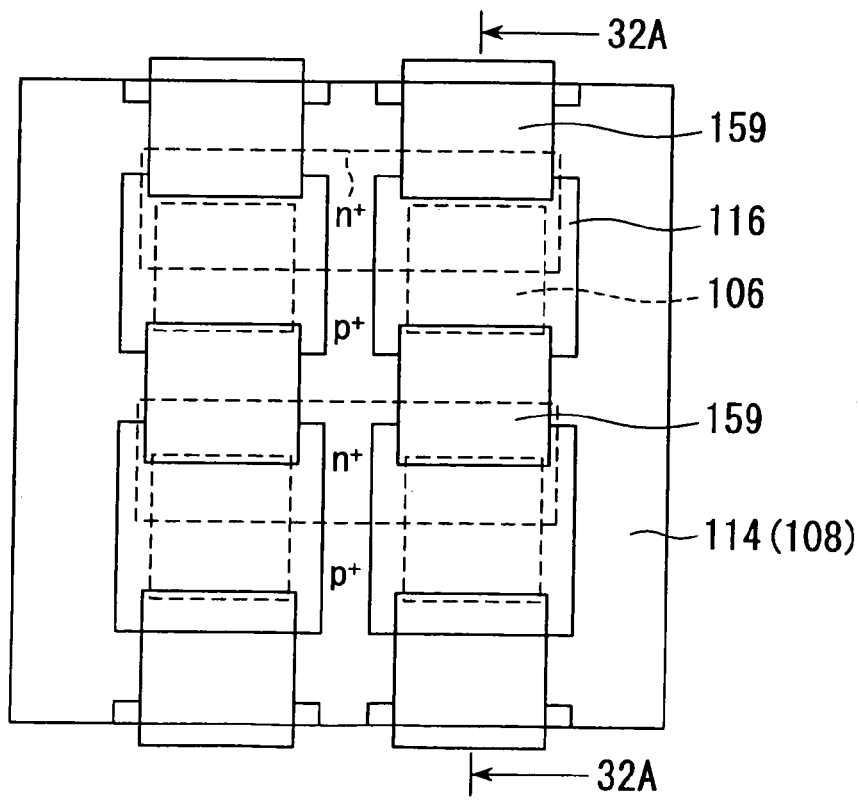

Then, as shown in FIG. 32B, a resist 159 is formed at an up/down direction space (in the Figure) of the silicon column 106. At this time, a cross-section as taken along the line 32A—32A in 32B is shown in FIG. 32A and it is different from that shown in FIG. 31.

Figure 33A:
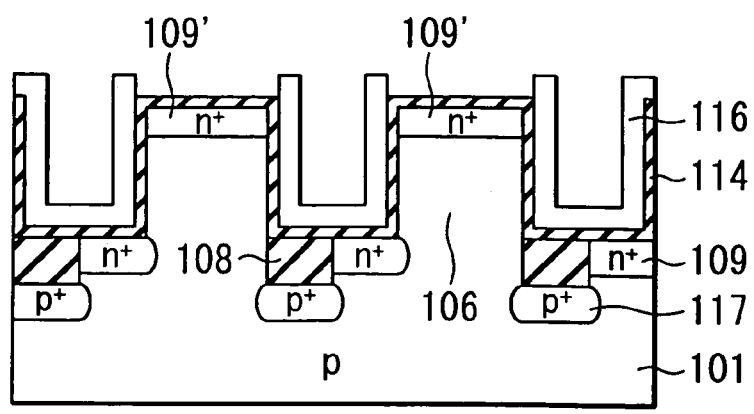
FIGS. 33A to 33C are views showing the steps following that of FIGS. 32A and 32B, FIG. 33C being a plan view and FIGS. 33A and 33B showing cross-sections as taken along the lines 33A—33A and 33B—33B, respectively, in FIG. 33C.
Figure 33B:
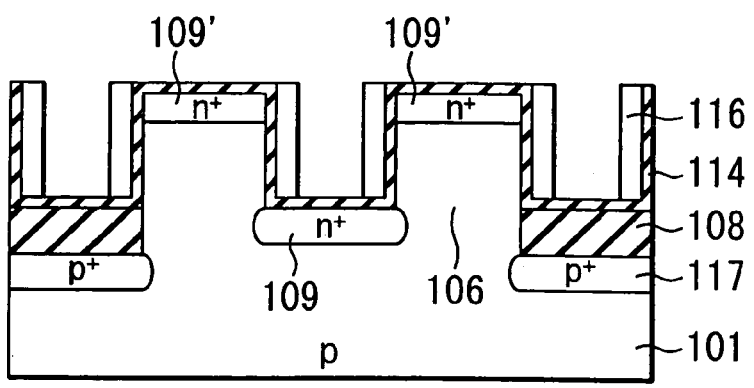
Figure 33C:
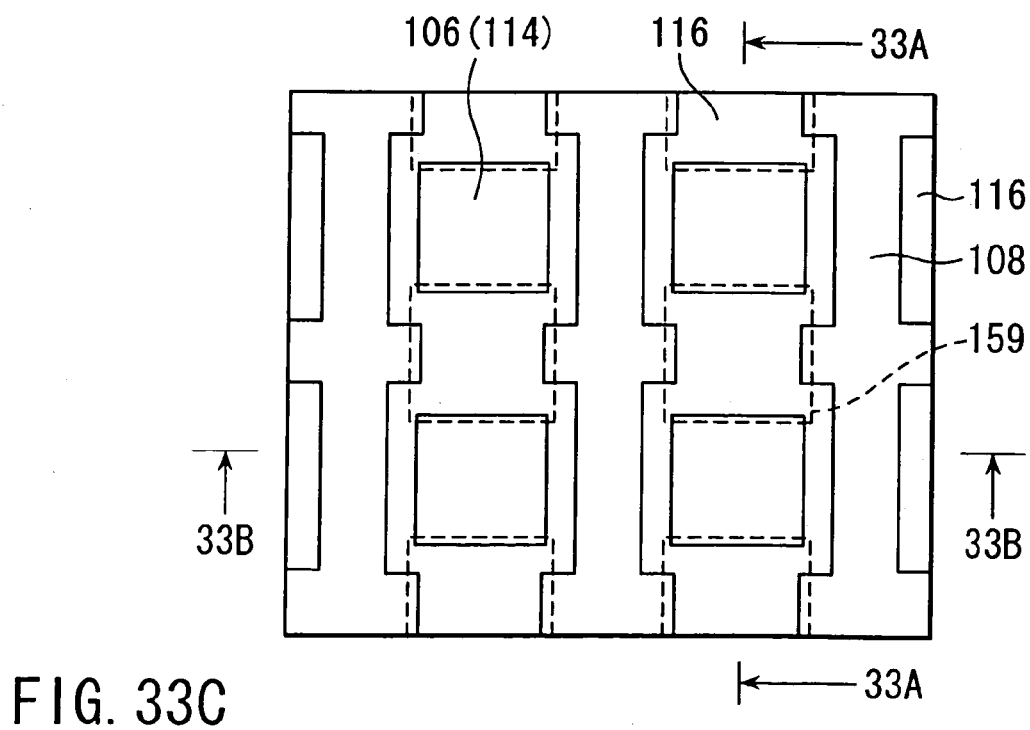

When the polysilicon film 116 is etched with the resist 159 used as a mask, a gate electrode remains on an outer surrounding sidewall of the silicon column 106 as shown in FIG. 33A and, as shown in FIG. 33C, a word line can be formed with the gate electrode connected in a direction of a 33A—33A line. FIG. 33B is a cross-sectional view as taken along the line 33B—33B in FIG. 33C. At this time, if a resist pattern is left at a transistor formation area in a peripheral circuit section (not shown), a polysilicon gate electrode of a conventional type transistor can be formed at the upper surface portion of a silicon substrate. After this, an As ion is implanted in the whole surface and an n⁺ diffusion layer 109' is formed on the upper surface of the silicon column 106.

Figure 34:
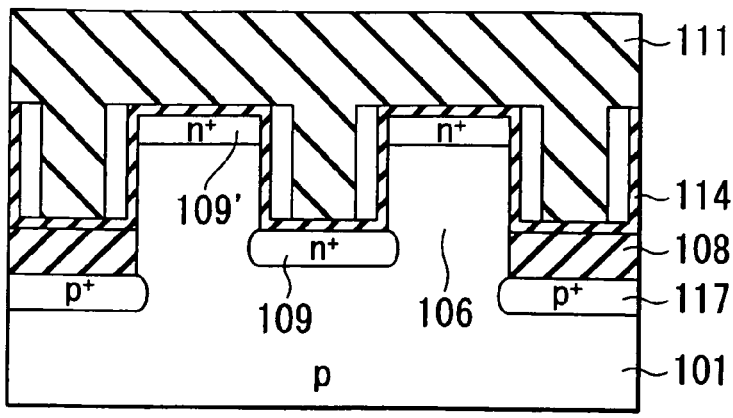
FIG. 34 is a view in vertical cross-section showing the step following those of FIGS. 33A to 33C.

Then, as shown in FIG. 34, a silicon oxide film 111 is deposited on the whole surface and it is planarized to bury a trench with the oxide film. It is to be noted that FIG. 34 is a cross-sectional view corresponding to a cross-section as taken along the line 33B—33B in FIG. 33C.

Figure 35A:
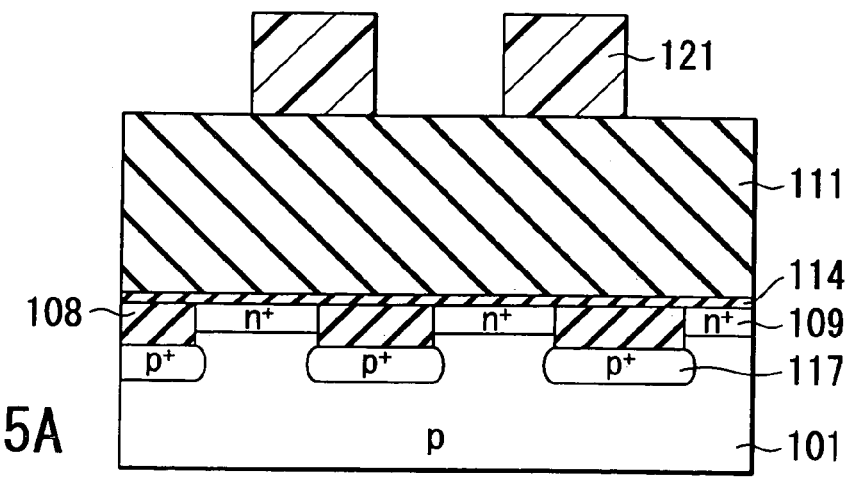
FIGS. 35A and 35B are a view showing the step following that of FIG. 34, FIG. 35B being a plan view and FIG. 35A showing a cross-section as taken along the line 35A—35A in FIG. 35B.
Figure 35B:
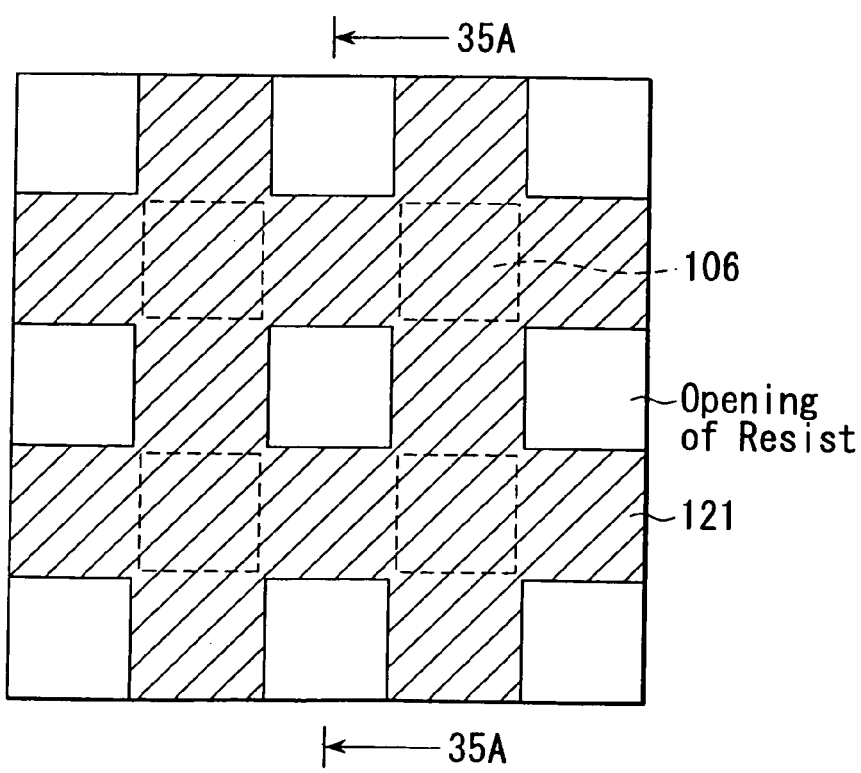

Then a resist 121 is formed on the whole surface and patterning is effected as shown in FIG. 35B. At this time, a cross-sectional view as taken along the line 35A—35A in FIG. 35B corresponds to FIG. 35A. With the resist 121 used as a mask, the silicon oxide film 111 is worked by the RIE etching. At this time, the etching is stopped at a stage at which the n⁺ diffusion layer 109 at the trench bottom is exposed. By doing so, a contact can be formed only at the n⁺ diffusion layer 109 at the trench bottom.

After this, the polysilicon on the side surface of the hole is thermally oxidized. At this time, the n⁺ diffusion layer at the trench bottom is also oxidized but, by performing RIE etching of the silicon oxide film, a contact can be formed at the n⁺ diffusion layer 109 in a self-aligned fashion with the gate polysilicon in an insulated state.

Figure 36:
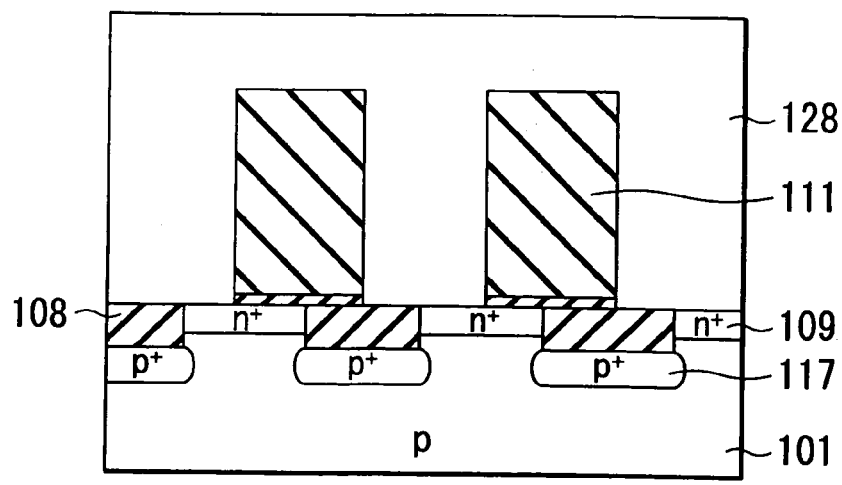
FIGS. 36 to 41 are views in vertical cross-section showing the steps sequentially following that of FIGS. 35A and 35B.
Figure 37:
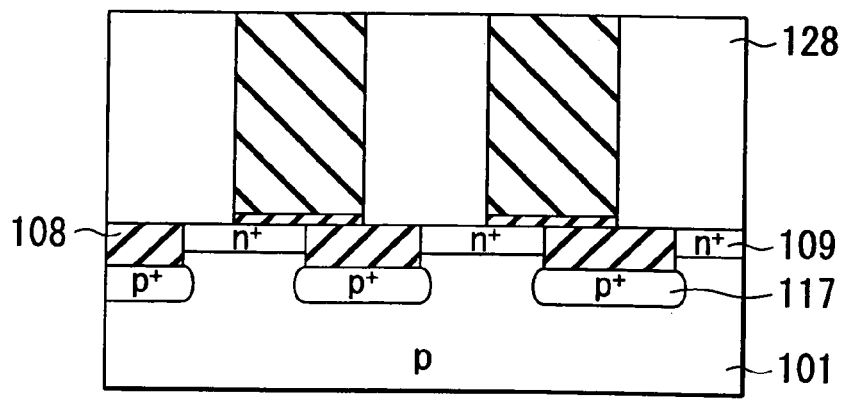

Then, as shown in FIG. 36, a polysilicon film 128 is formed on the whole surface and it is planarized by the CMP method to bury, with the polysilicon film, the hole formed at a previous step (FIG. 37).

It is to be noted that FIGS. 36 to 41 are cross-sections taken along the same plane as the cross-section of FIG. 35A.

Figure 38:
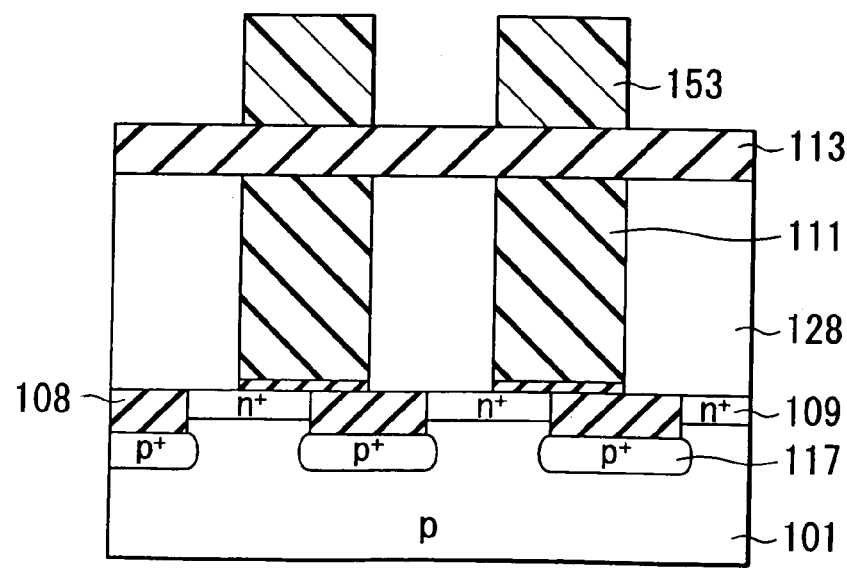

Then, as shown in FIG. 38, a silicon oxide film 113 is deposited and, on it, a line-like resist mask 153 is formed in a state aligned with the width of the silicon oxide film 111 and in a state extending in a vertical direction to the paper.

Figure 39:
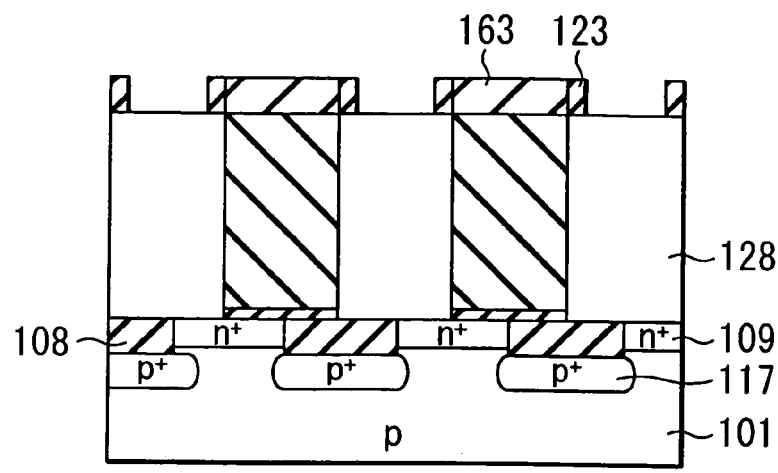

Then, as shown in FIG. 39, with the resist 153 used as a mask, a silicon oxide film 163 is worked by the RIE etching and the etching is performed to expose the polysilicon layer 128 and provide a groove. Then, SIN is thinly deposited on the whole surface and, by the RIE etching, an SiN film 123 is formed on the side surface of the groove.

Figure 40:
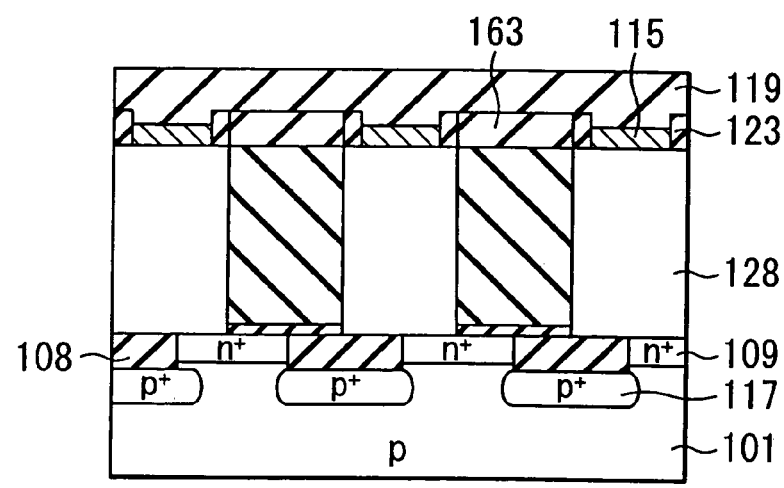
Figure 41:
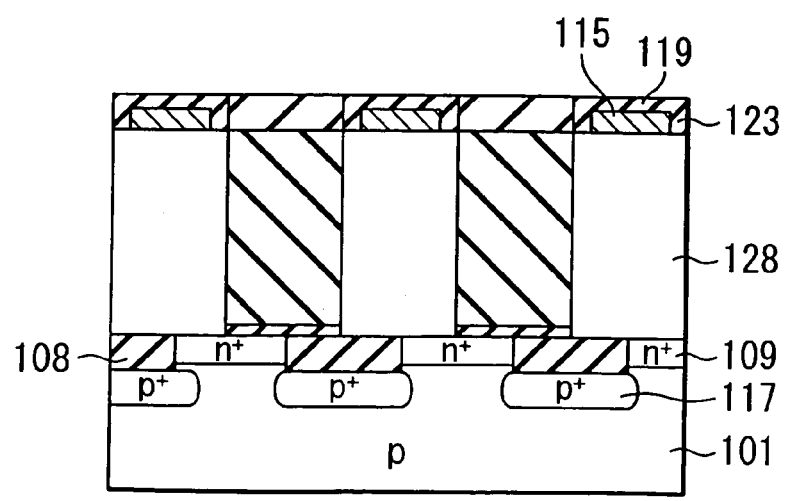

Then, a W film is deposited on the whole surface and, by planarizing it by the CMP and performing an etch-back process by the RIE etching, it is formed as a W film 115 serving as a bit line. Then, as shown in FIG. 40, an SiN film 119 is again deposited and, by planarizing it by the CMP method, it is buried onto the upper portion of the W film 115. By doing so, as shown in FIG. 41, the W film 115 serving as a bit line is so formed as to be surrounded with the SiN films 123 and 119.

After this, a silicon oxide film 124 is deposited and a resist mask having an opening at the upper surface of the silicon column 106 is formed. With this used as a mask, the silicon oxide film 124 is etched to provide an opening. At this time, the etching of the silicon oxide film is performed under the condition that the SiN films 123 and 119 around the bit line are not etched.

Figure 15B:
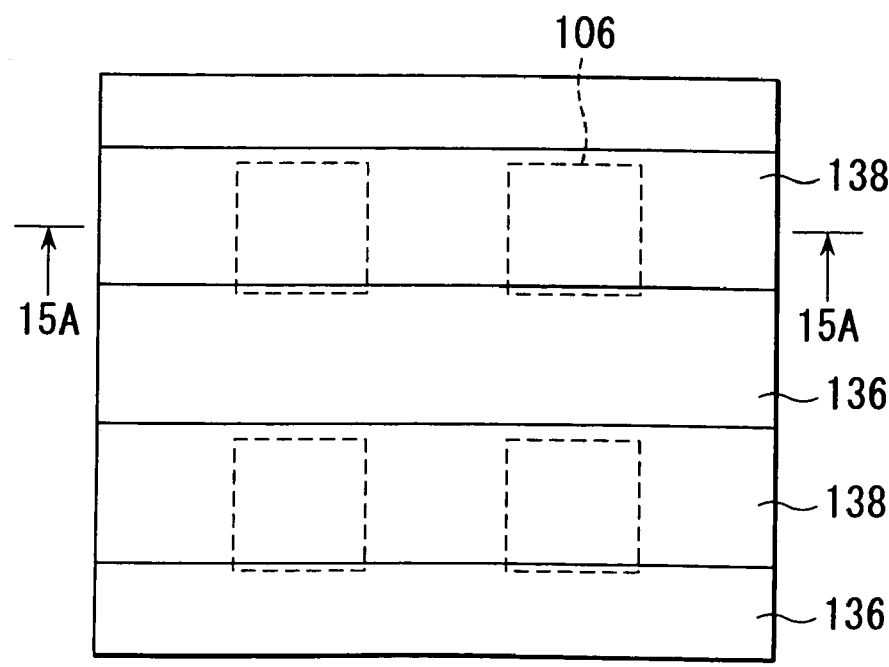
Figure 42A:
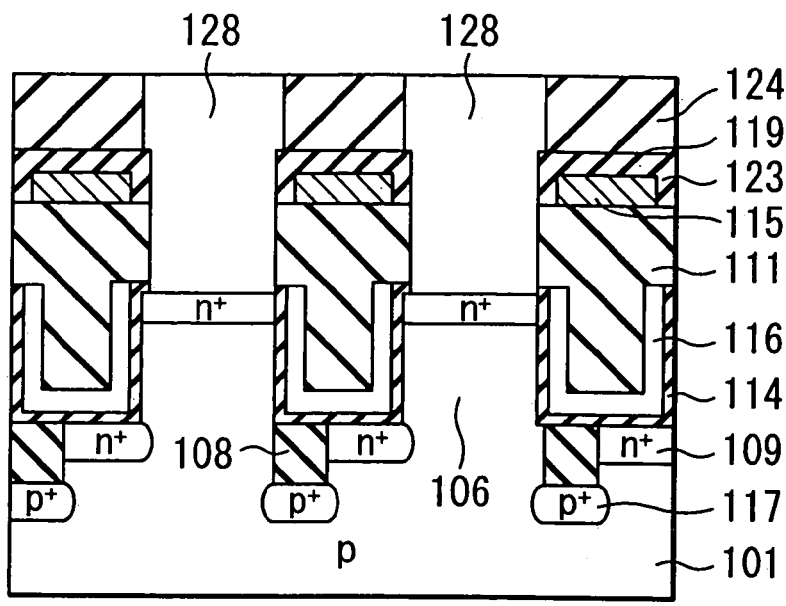
FIGS. 42A and 42B are views showing the step following that of FIG. 41, FIG. 42B being a plan view and FIG. 42A showing a cross-section as taken along the line 42A—42A in FIG. 42B.
Figure 42B:
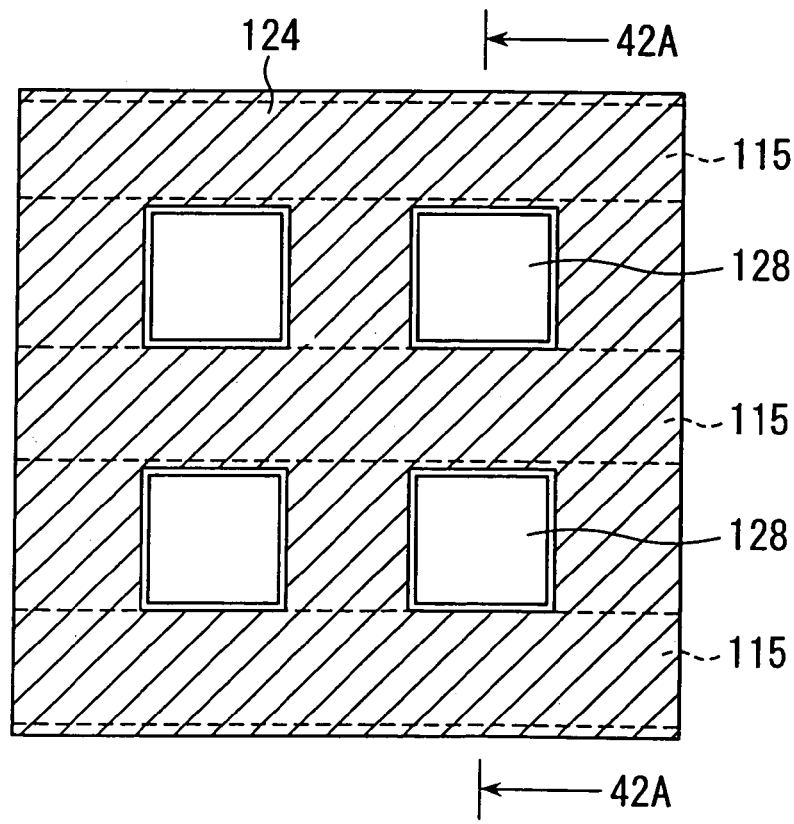

Then, as shown in FIG. 42A, impurity-doped polysilicon is buried into the above-mentioned opening to make it integral with an already formed polysilicon plug 128. And the upper surface is planarized. It is to be noted that, although FIG. 42A shows a cross-section as taken along the line 42A—42A in FIG. 42B, the polysilicon plug 128 is shown in an already integrated form. The subsequent process is the same as that shown in FIG. 14 of the first embodiment. It is to be noted that, in the process of FIGS. 15A and 15B, it is not needed to pattern the plate electrodes 134, 136 in a line-like state with the use of the resist 138.

By the manufacturing process as set out above, it is possible to form a $4F^2$ type memory cell in a circuit system where a constant voltage is applied to the plate voltage.

Fourth Embodiment

The memory cell of the fourth embodiment also has an equivalent circuit the same as that of the conventional technique as shown in FIG. 1A and is of a type that a constant voltage is applied to the plate electrode of a capacitor, but it is also of a type that an $n^+$ diffusion layer is formed at a trench bottom side around the root area of a silicon column and, to this, a connection line for connection to a bit line formed at the upper side of the silicon column is connected.

Figure 43A:
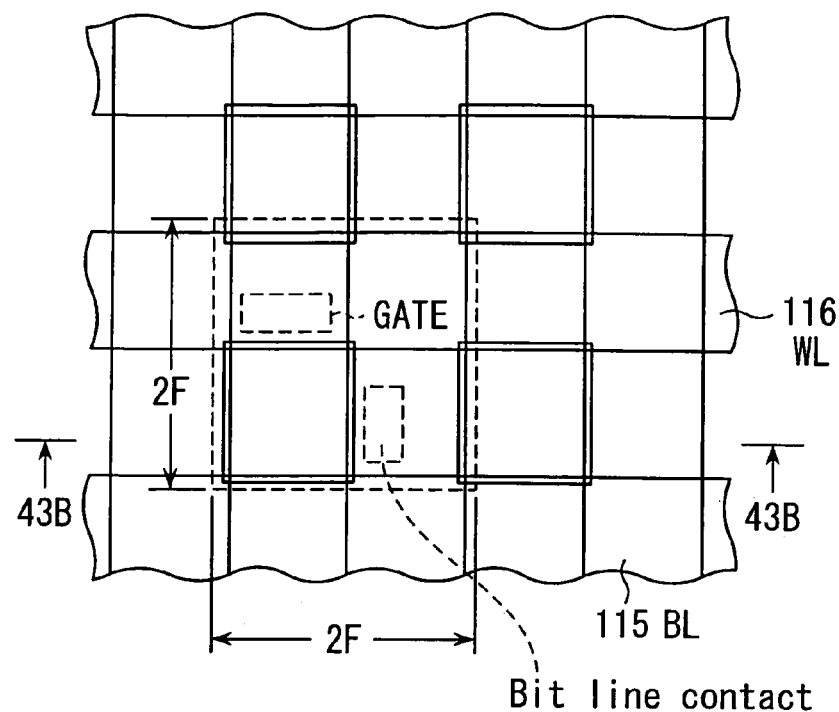
FIGS. 43A and 43B are views for explaining the manufacturing steps of a memory cell according to a fourth embodiment, FIG. 43A being a plan view and FIG. 43B showing a cross-section as taken along the line 43B—43B in FIG. 43A.
Figure 43B:
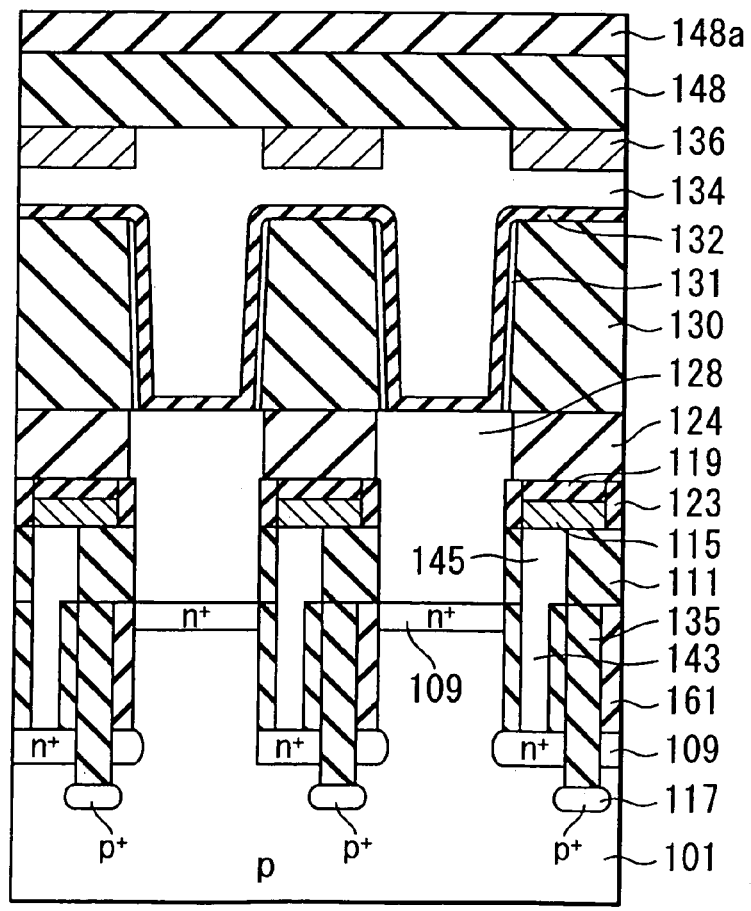

FIG. 43A is a planar layout diagram of a memory cell according to the fourth embodiment and FIG. 43B shows a cross-sectional view. Even if such a structure is adopted, it is possible to realize a memory cell of an occupation area $4F^2$. An explanation will be made below about the manufacturing process of this memory cell, noting that, for easiness in understanding, the same reference numerals are employed to designate portions or areas corresponding to that shown in the first embodiment.

Figure 44:
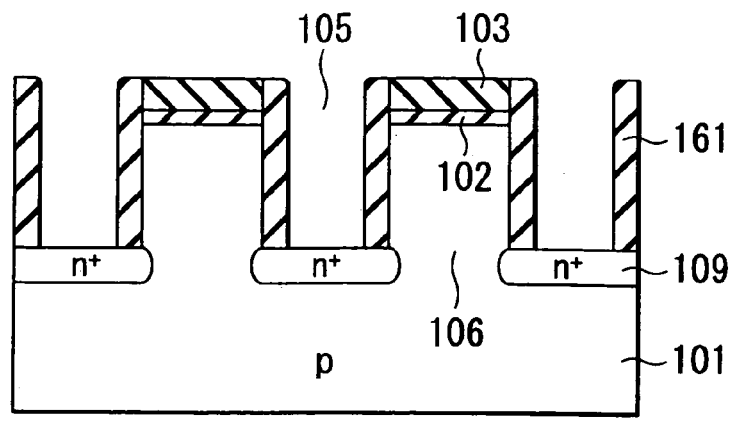
FIG. 44 is a view in vertical cross-section showing the step following that of FIGS. 43A and 43B.

First, as in the case of FIGS. 4A and 4B of the first embodiment, a silicon column 106 as shown in FIG. 44 is formed. That is, an about 10 nm buffer oxide film 102 is formed on the surface of a p type silicon substrate 101 and an about 200 nm SiN film 103 is deposited on the surface and then a resist (104, not shown) is coated on the surface. Squares with a minimal work dimension F are formed, by patterning, as in the case of FIG. 4B, with the use of a lithography technique. Then the SiN film 103, buffer oxide film 102 and surface portion of a silicon substrate 101 are sequentially etched to provide a silicon trench 105. Then an As ion is implanted to form an $n^+$ diffusion layer 109 only at the bottom side of the silicon trench. After this, an oxide film having a thickness about one-half the space of the silicon trench is uniformly deposited and it is etched by the RIE process to provide a silicon oxide film 161 only at a sidewall of the silicon column 106.

Figure 45A:
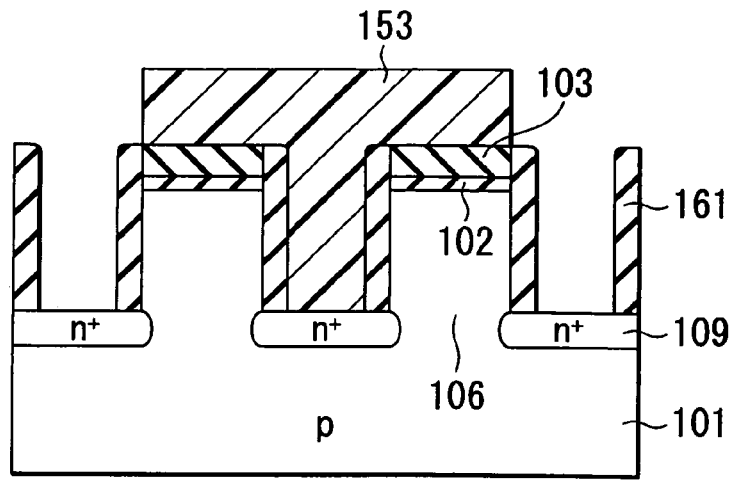
FIGS. 45A and 45B are views showing the step following that of FIG. 44, FIG. 45B being a plan view and FIG. 45A showing a cross-section as taken along the line 45A—45A in FIG. 45B.
Figure 45B:
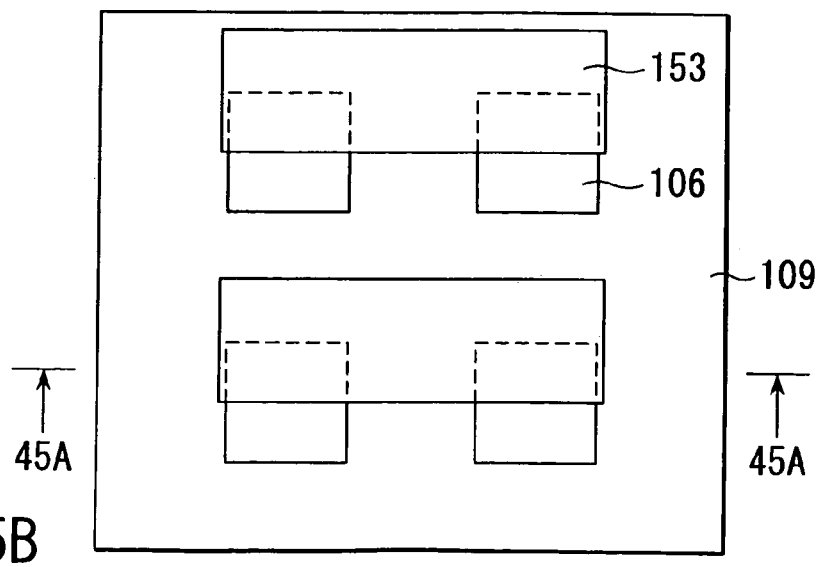

Then, as shown in FIGS. 45A and 45B, a resist mask 153 is so formed as to cover laterally adjacent two silicon columns 106 in FIG. 45A and in a one-half overlapped relation to the silicon column 106 as shown in FIG. 45B. Using the resist 153 and SiN film 103 over the upper surface of the silicon column 106 and silicon oxide film 161 on the sidewall of the silicon column 106 as a mask, the silicon substrate is etched by the RIE process and, at this time, etching is done to a level sufficiently deep to allow the associated $n^+$ type diffusion layer 109 at the bottom portion of the silicon trench to be removed.

In FIG. 45B, the $n^+$ diffusion layer 109 masked with the resist 153 and left beneath the resist 153 serves as a source/drain layer (impurity layer) shared by respective adjacent memory cells.

Figure 46A:
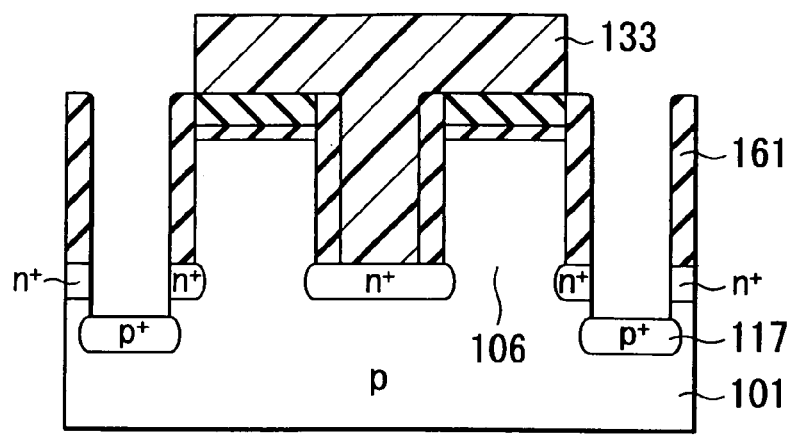
FIGS. 46A and 46B are views showing the step following that of FIGS. 45A and 45B, FIG. 46B being a plan view and FIG. 46A showing a cross-section as taken along the line 46A—46A in FIG. 46B.
Figure 46B:
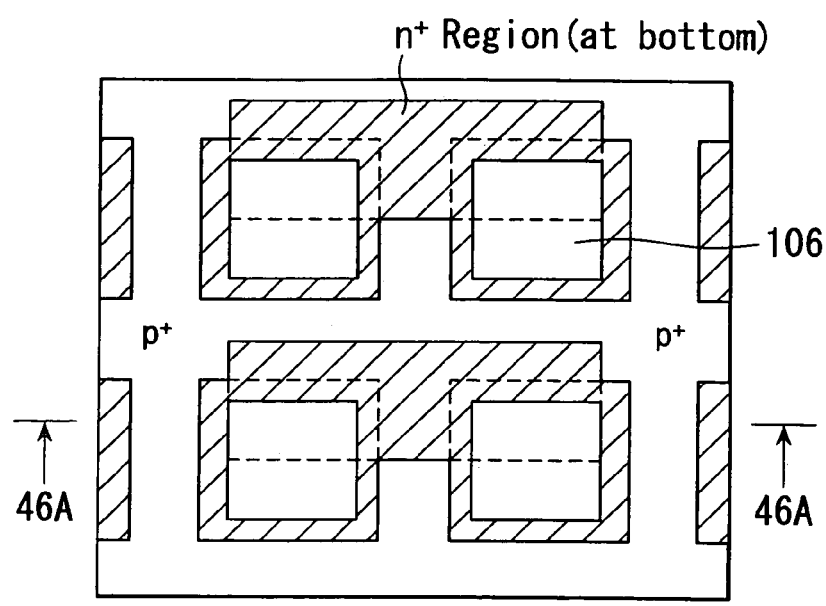

Then, as shown in FIG. 46, a boron ion is implanted to form an element isolation $p^+$ layer 117 at the bottom of the silicon trench. FIG. 46B shows a planar layout of the silicon substrate at this time with respect to the conductivity type. The $n^+$ diffusion layer is formed around the trench bottom side of the silicon column 106 and is so configured as to have these adjacent two ring-like diffusion layers connected at the trench bottom site.

Figure 47:
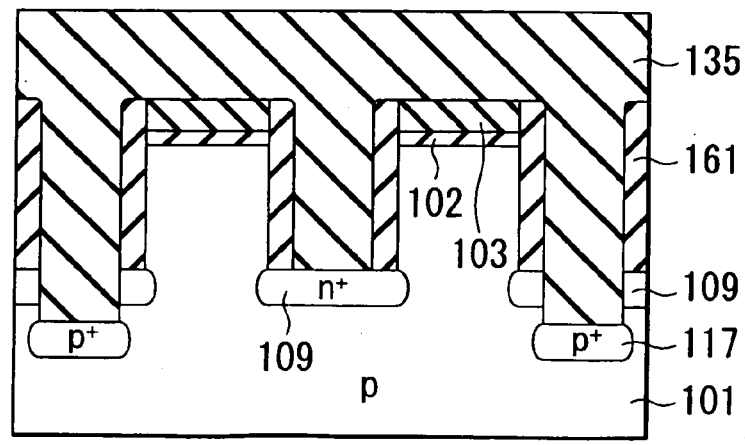
FIG. 47 is a view in vertical cross-section showing the step following that of FIGS. 46A and 46B.

Then, as shown in FIG. 47, a silicon oxide film 135 is deposited on the whole surface to bury the silicon trench with the silicon oxide film and the surface is planarized by the CMP method.

Figure 48A:
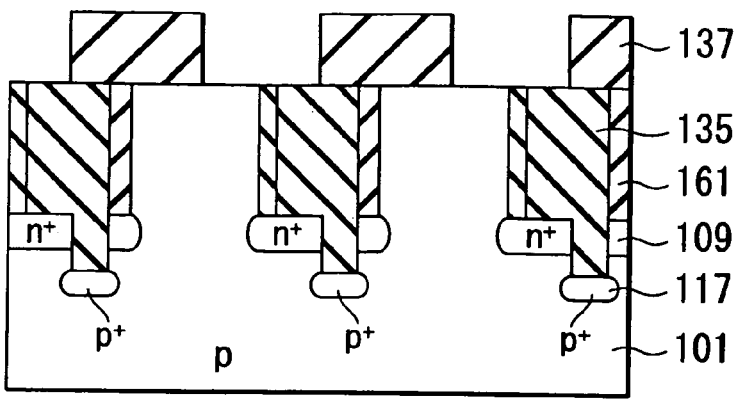
FIGS. 48A and 48B are views showing the step following that of FIG. 47, FIG. 48B being a plan view and FIG. 48A showing a cross-section as taken along the line 48A—48A in FIG. 48B.
Figure 48B:
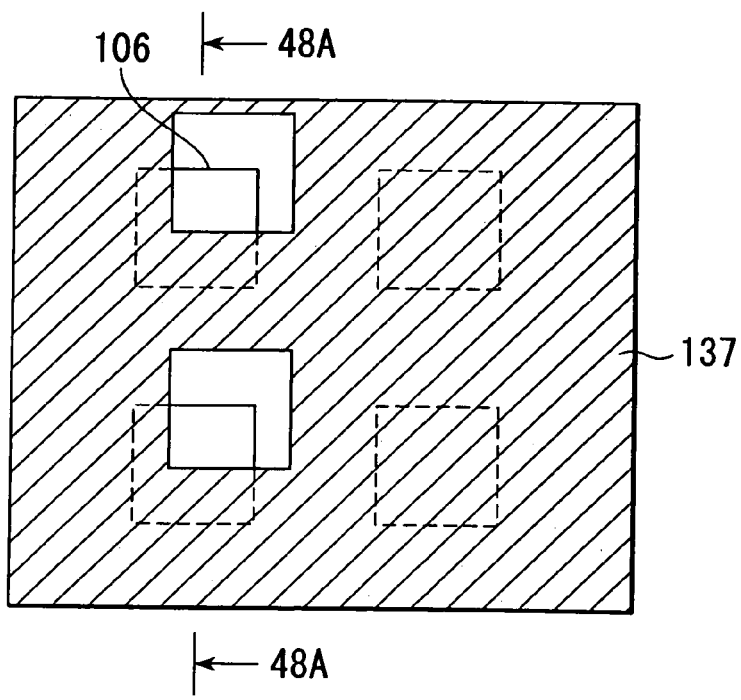

Then as shown in FIG. 48B, a resist mask 137 having openings exposing the upper right portions of those left-side two silicon columns of mutually adjacent four silicon columns 106 is formed and, using this, a silicon oxide film 135 is etched by the RIE process. This mask 137 is for use in a memory cell of a 2-cell-one-bit-line configuration and, in a one-cell-one-bit-line configuration, use may be made of a mask having openings on the upper right portions of all four silicon columns. In this case, it is possible to omit the formation of the $n^+$ diffusion layer connecting together the $n^+$ diffusion layers of two silicon columns at the silicon trench bottom.

Figure 49:
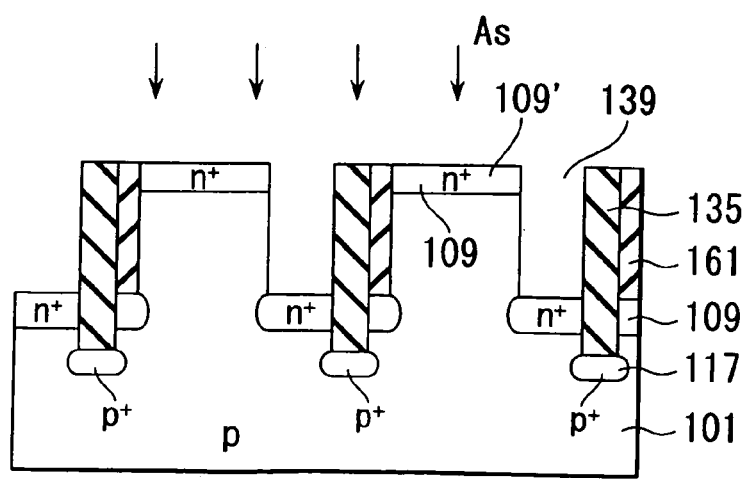
FIGS. 49 and 50 are views in vertical cross-section showing the steps sequentially following that of FIGS. 48A and 48B.

FIG. 49 shows a state in which a hole 139 is formed in the silicon oxide film 135 by the RIE process. The hole 139 is so formed as to have its bottom surface just brought down to the $n^+$ diffusion layer 109. Then, after the removal of the resist mask 137, As ions are implanted to form an $n^+$ diffusion layer 109' at the upper side of the silicon column 106.

Figure 50:
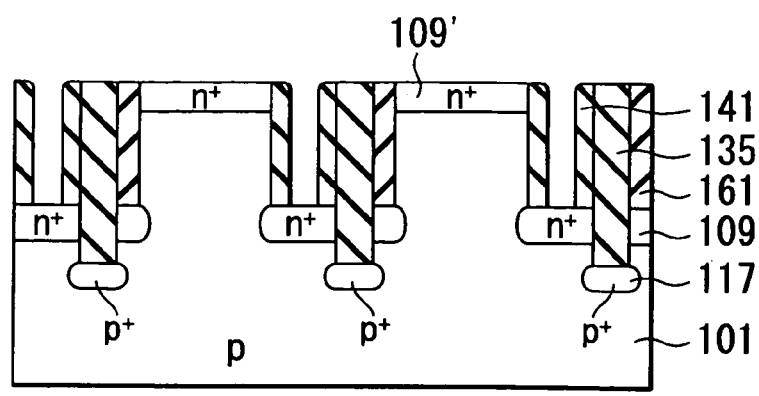

Then, as shown in FIG. 50, in order to form an insulating film on the side surface of the silicon column 106, a silicon oxide film 141 is deposited at a thickness corresponding to below one-third the diameter of the hole 139 and, by etching this film by the RIE process, the silicon oxide film 141 is left only on the side surface of the hole 139.

Figure 51A:
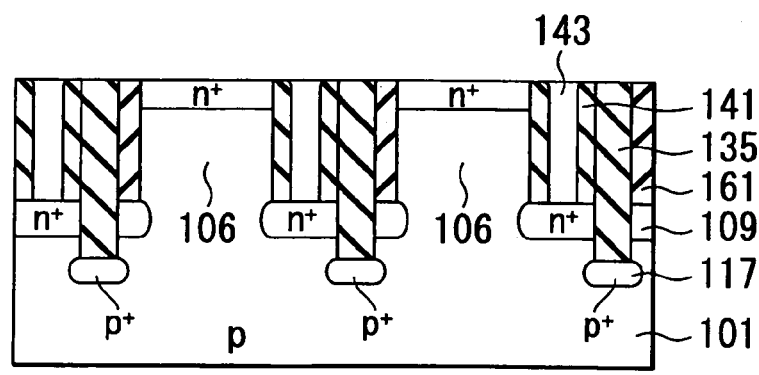
FIGS. 51A and 51B are views showing the step following that of FIG. 50, FIG. 51B being a plan view and FIG. 51A showing a cross-section as taken along the line 51A—51A in FIG. 51B.
Figure 51B:
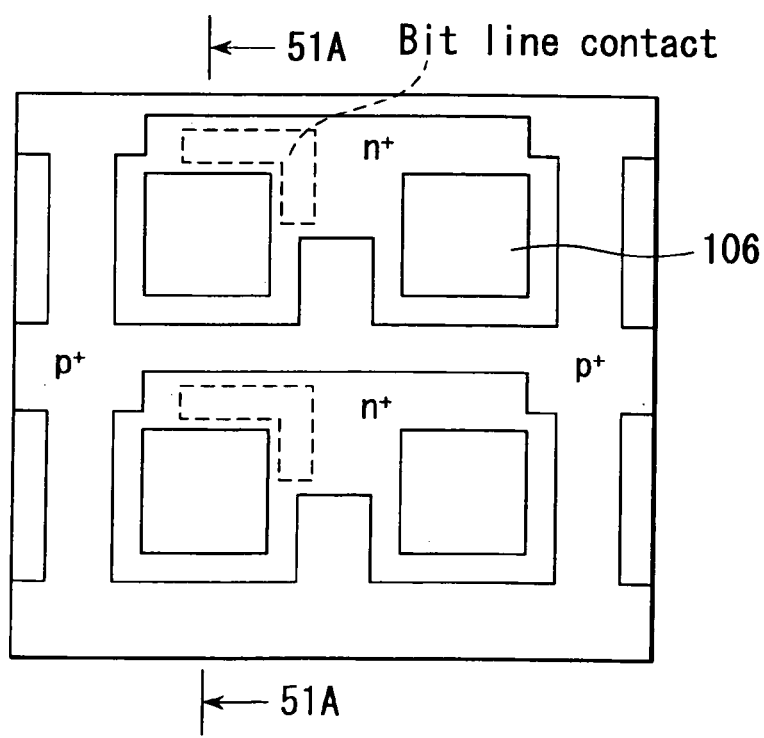

Into the hole formed at this time, an impurity-doped polysilicon 143 is buried as shown in FIG. 51A and the surface is planarized by the CMP method. By doing so, the $n^+$ diffusion layer 109 at the silicon trench bottom side can be connected through the plug 143 to an upper surface position of the silicon column. FIG. 51B shows an arranged state of the diffusion layer at the trench bottom at this time. In this way, a ring-like $n^+$ diffusion layer is formed to surround the silicon column and it is so configured as to be connected by the $n^+$ layer to the adjacent ring-like $n^+$ diffusion layer.

Figure 52:
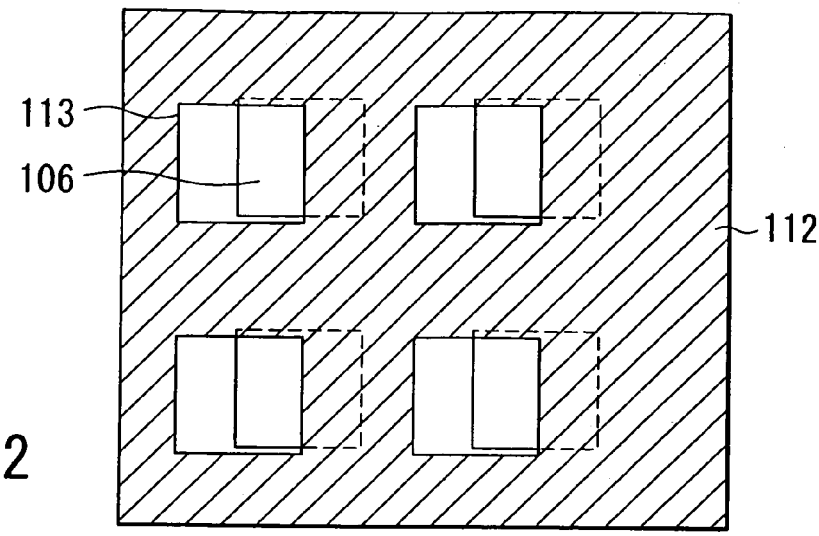
FIG. 52 is a plan view showing a mask configuration used at the step following that of FIGS. 51A and 51B.

Then, as shown in FIG. 52, a resist mask 112 having openings 113 is so formed as to expose the silicon column 106 by one-half thereof and, with this used as a mask, silicon oxide films 161 and 135 are etched to expose a sidewall of the silicon column 106.

Figure 53A:
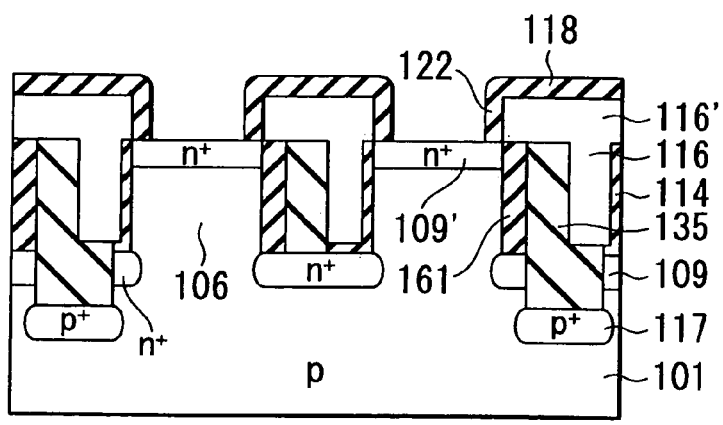
FIGS. 53A and 53B are views showing the step following that of FIGS. 51A and 51B, FIG. 53B being a plan view and FIG. 53A showing a cross-section as taken along the line 53A—53A in FIG. 53B.
Figure 53B:
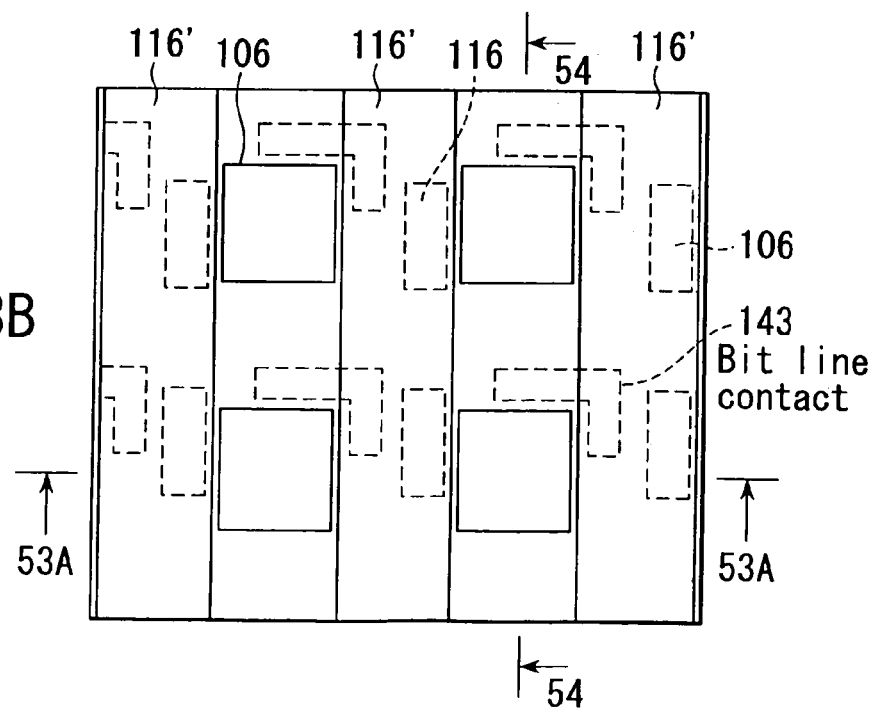

Then, as shown in FIG. 53A, a gate oxide film 114 is formed on the sidewall of the exposed silicon column 106. Into the formed hole an impurity-doped polysilicon 116 is buried and a polysilicon 116' is deposited to make connection to the polysilicon 116, so that a word line is formed. At this time, SiN 122 and 118 are deposited on the upper surface and side surface of the word line 116' and, when a plug is formed on the upper surface of the silicon column, it is so formed as to prevent the plug from being short-circuited with the word line. FIG. 53B shows a layout state of the trench bottom's diffusion layer, word line, gate electrode, and so forth at this time.

Figure 54:
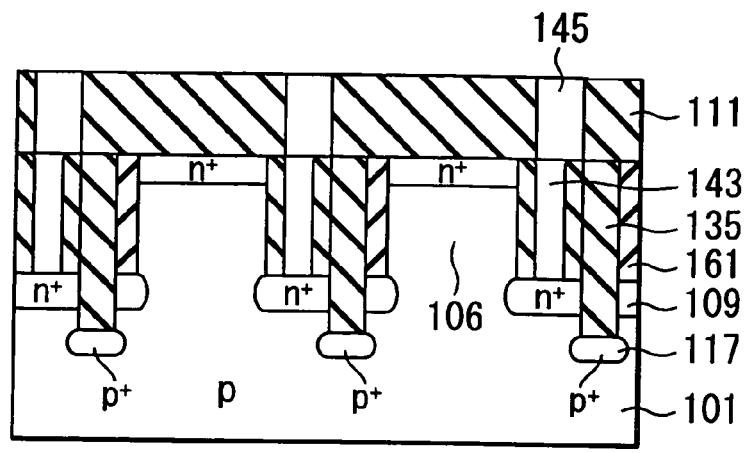
FIGS. 54 and 55 are views in vertical cross-section sequentially showing the steps following that of FIGS. 53A and 53B.

Then, as shown in FIG. 54, a silicon oxide film 111 is deposited and it is planarized by the CMP method. It is to be noted that FIG. 54 corresponds to a cross-section as taken along the line 54—54 in FIG. 53B. A contact hole is opened by the lithography technique in the silicon oxide film 111 at the upper side of the bit line contact plug 143 and it is buried with the impurity-doped polysilicon to provide a second bit line contact plug 145. In order that, at this time, the second bit line plug 145 may be formed in a self-aligned relation to the word line, the silicon oxide film 111 is etched by the RIE process under the condition that a greater selectivity is obtained against the SiN layers 122 and 118.

Figure 55:
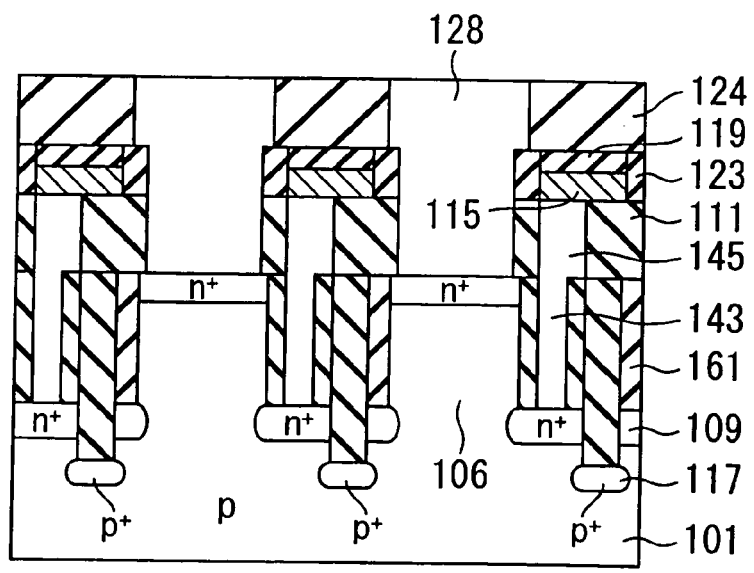

Then, as shown in FIG. 55, a bit line 115 is formed on the second bit line plug 145. The formation of the bit line 115 may be performed by the method explained in connection with FIGS. 39 to 41 of the third embodiment. Then, as in the case of FIG. 42 of the third embodiment, a silicon oxide film 124 is deposited and a storage node contact hole is formed at the upper side of the silicon column 106 and polysilicon is buried into it to provide a storage node contact plug 128.

A subsequent process is the same as that of FIG. 14, et seq., of the first embodiment, noting that, in FIG. 15 process, it is not necessary to pattern the plate electrodes 134 and 136 in a line-like configuration with the use of the resist 138.

By the above-mentioned manufacturing process it is possible to form a memory cell of a $4F^2$ type similar to that of the third embodiment.

Fifth Embodiment

Although, in the fourth embodiment, the bit line contact is formed at a rate of one per 2 bits at the trench bottom (see FIG. 51B) or at a rate of one per 1 bit, the formation of the $n^+$ diffusion layer at the trench bottom can be made in a 2-bit shared relation, and, further, in a multi-bit shared relation. The embodiment of FIG. 5 shows such an example and the size of the contact formation section is increased to achieve the easiness with which a work process can be done.

As shown in FIG. 56, an $n^+$ diffusion layer (impurity layer) 202 at the trench bottom is so patterned as to be made in a one-half overlapped relation to many silicon columns. By doing so, it is possible to connect all associated silicon columns 201 in a shared relation to the $n^+$ diffusion layer 202 (for example, see FIGS. 45A, 45B, 46A and 46B). In the case where, however, the diffusion resistance is greater than the ON resistance of the transistor, a memory write-in/readout rate will be slower due to the diffusion resistance. In this case, the number of parallel-connected silicon columns 201 may be restricted to, for example, five or ten per contact.

According to the above-mentioned arrangement, even if the space of a contact 203 is made greater, the cell size is not increased because it becomes ⅕, ⅒ per cell. If a greater size of the contact 203 is adopted, an array pitch (normal pitch) of the silicon columns 201 in the bit line direction becomes greater, that is, wider, at the contact 203 site and there is involved a loose pitch at that site.

Sixth Embodiment

Although, in the first to fifth embodiments, the lithography process is performed at intervals of F relative to the holes having one side F, the $4F^2$ cell size provides a lower limitation in this method. The sixth embodiment provides a manufacturing method capable of manufacturing a cell size of below $4F^2$.

FIGS. 57A and 57B, each, show a model diagram for explaining the manufacturing method of the sixth embodiment and use is made of a light exposing means capable of patterning 0.5F-sized silicon columns 301 at intervals of 2F. Stated in more detail, even if use is made of an exposure mask having a square opening with one side given by F, it is possible to form a resist mask of 0.5F size by properly selecting the light-sensitive or developing conditions of the resist.

This can be realized by twice subjecting to light exposure with the relative position of a reticle mask and wafer shifting at an interval of $\sqrt{2}F$ in a lower right diagonal direction shown in FIG. 57B with the use of the above-mentioned lithography light exposure means. In this case, the pitch of the silicon columns 301 becomes $\sqrt{2}F$ in the diagonal direction and the memory size becomes $2F^2$. At this time, the alignment accuracy is determined by the stepping accuracy of the light exposure device and, in the present state, is of the order of 15 to 20 nm. Since F at the time of using a design rule of, for example, 0.1 μm is 100 nm, it may be said that the positional error falls within 20%.

If, in this case, in order to form a plurality of silicon columns 301, the width of each trench in a grid-like array at the silicon substrate is given by A and the silicon column is comprised of a square configuration with one side of length B, then A+B=2F and the first to fourth embodiments correspond to A=B. In the sixth embodiment, A=3B and F=2B. Thus, the moving distance $\sqrt{2}F$ in FIG. 57B becomes $2^{1.5}B$.

Even if there is a size error in the same chip, the same light exposure is made at a light exposure time after movement under the use of the same mask and there is less error involved. By repeating this method a multiple of times, it is possible to theoretically obtain a cell size of $F^2$, $0.5F^2$. At this time, at the both ends on the diagonal line (shown by dashed line) 90° orthogonal to a moving direction at the light exposure time of the memory cell array, no memory cell is patterned (at a site x in FIG. 57B). Thus, uppermost/lowermost or rightmost/leftmost lines of the memory cell arrays may be used as dummy patterns.

According to the present invention, as set out above, it is possible to obtain a very small memory cell of a size of below $4F^2$ by using the vertical type transistor. In the case where the vertical type transistor is obtained with the use of a stacking type memory cell, it is necessary to connect the source/drain formed beneath the silicon column to the bit line. In the prior art technique, however, it is necessary to adopt a complicated process such as burying the bit line material down into the silicon column. According to the present invention, it is possible that, simply by slightly varying an element isolation STI (shallow trench isolation) process in the prior art technique, the bit line is formed at the upper side of the silicon column and a better matching is obtained relative to the conventional process. Thus, it is possible to realize a low-cost DRAM in a shorter process.

Although, in the above-mentioned embodiment, a first conductive type and second conductive type have been used as a p type and n-type, it may be possible to replace them with an n type and p type, respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a silicon substrate of a first conductivity type having a grid trench extending in two mutually orthogonal directions in an upper major surface of the silicon substrate, the trench having a trench width;
   a plurality of silicon columns formed on the major surface of the substrate and having a square upper surface defined by the trench, the square upper surface having a side length;
   a plurality of transistors each formed on a side surface of the respective silicon columns, each of the transistors comprising:
      a first impurity layer formed on the square upper surface of corresponding one of the silicon columns and serving as one of a source and a drain;
      a second impurity layer formed on a bottom of the trench adjacent to the corresponding one of the silicon columns and serving as the other of the source and the drain;
      a channel portion formed on a side surface of the corresponding one of the silicon columns between the first impurity layer and the second impurity layer;
      a gate insulating film formed on the channel portion; and
      a gate electrode formed over the channel portion with the gate insulating flim interposed therebetween;
   a plurality of capacitors each having two electrodes, one of the two electrodes being connected to the first impurity layer;
   a connection line configured to bring the second impurity layer, which is connected to the second impurity layer of an adjacent one of the transistors, out to the major surface of the silicon substrate; and
   a bit line formed above the major surface of the silicon substrate,
   wherein the connection line is insulatively buried in the trench so as to extend from the second impurity layer on the bottom of the trench to an upper side of the trench and be connected to the bit line, and
   wherein the plurality of silicon columns form an array of a matrix form and one pair of the silicon columns at both corners on a diagonal line of the matrix form are lacking.

2. The semiconductor memory device according to claim 1, wherein the width of the trench is equal to the side length of the upper surface of the respective silicon columns.

3. The semiconductor memory cell according to claim 1, wherein the plurality of capacitors are formed on the plurality of silicon columns, respectively, each of the capacitors comprising
   a capacitor electrode connected to the first impurity layer and being the one electrode;
   a dielectric film formed on the capacitor electrode; and
   a storage electrode opposing the capacitor electrode through the dielectric film.

4. The semiconductor memory device according to claim 3, wherein each of the capacitors has a planar size that is substantially the same as a size of the upper surface of the silicon column.

5. The semiconductor memory device according to claim 1, wherein the gate electrode is so formed as to surround the corresponding one of the silicon columns and, wherein the gate electrodes of the silicon columns aligned in one direction are connected to form a word line and the connection line is formed in the trench at a central area surrounded by mutually adjacent four of the silicon columns.

6. The semiconductor memory device according to claim 1, wherein the gate electrode is formed on one side surface of the corresponding one of the silicon columns and, wherein the gate electrodes of the silicon columns aligned in one direction are connected to form a word line and the connection line is formed in the trench along another side surface adjacent to the one side surface of the corresponding one of the silicon columns.

7. The semiconductor memory device according to claim 1, wherein an aligning pitch of the silicon columns in an extending direction of the bit line is made loose at a site where the second impurity layer is connected to the connection line at the bottom of the trench.

8. The semiconductor memory device according to claim 1, wherein the second impurity layer is formed as a band configuration around a corresponding one of the silicon columns.

9. The semiconductor memory device according to claim 1, wherein the second impurity layer is united with respect to adjacent three or more of the silicon columns on the bottom of the trench.

10. A semiconductor memory device comprising:
    a silicon substrate of a first conductivity type having a grid trench extending in two mutually orthogonal directions in an upper major surface of the silicon substrate, the trench having a trench width;
    a plurality of silicon columns formed on the major surface of the substrate and having a square upper surface defined by the trench, the square upper surface having a side length;
    a plurality of transistors each formed on a side surface of the respective silicon columns, each of the transistors comprising
       a first impurity layer formed on the square upper surface of corresponding one of the silicon columns and serving as one of a source and a drain;
       a second impurity layer formed on a bottom of the trench adjacent to the corresponding one of the silicon columns and serving as the other of the source and the drain;
       a channel portion formed on a side surface of the corresponding one of the silicon columns between the first impurity layer and the second impurity layer;
       a gate insulating film formed on the channel portion; and
       a gate electrode formed over the channel portion with the gate insulating film interposed therebetween;
    a plurality of capacitors each having two electrodes, one of the two electrodes being connected to the first impurity layer;
    a connection line configured to bring the second impurity layer, which is connected to the second impurity layer of an adjacent one of the transistors, out to the major surface of the silicon substrate; and
    a bit line formed above the major surface of the silicon substrate,
    wherein the connection line is insulatively buried in the trench so as to extend from the second impurity layer on the bottom of the trench to an upper side of the trench and be connected to the bit line, and
    an aligning pitch of the silicon columns in an extending direction of the bit line is made loose at a site where the second impurity layer is connected to the connection line at the bottom of the trench.

11. A semiconductor memory device comprising:
    a silicon substrate of a first conductivity type having a grid trench extending in two mutually orthogonal directions in an upper major surface of the silicon substrate, the trench having a trench width;

a plurality of silicon columns formed on the major surface of the substrate and having a square upper surface defined by the trench, the square upper surface having a side length;

a plurality of the transistors each formed on a side surface of the respective silicon columns, each of the transistors comprising a first impurity layer formed on the square upper surface of corresponding one of the silicon columns and serving as one of a source and a drain;

a second impurity layer formed on a bottom of the trench adjacent to the corresponding one of the silicon columns and serving as the other of the source and the drain;

a channel portion formed on a side surface of the corresponding one of the silicon columns between the first impurity layer and the second impurity layer;

a gate insulating film formed on the channel portion; and a gate electrode formed over the channel portion with the fate insulating film interposed therebetween;

a plurality of capacitors each having two electrodes, one of the two electrodes being connected to the first plurality layer;

a connection line configured to bring the second impurity layer, which is connected to the second impurity layer of an adjacent one of the transistors, out to the major surface of the silicon substrate; and a bit line formed above the major surface of the silicon substrate, wherein the connection line is insulatively buried in the trench so as to extend from the second impurity layer on the bottom of the trench to an upper side of the trench and be connected to the bit line, and the second impurity layer is united with respect to adjacent three or more of the silicon columns on the bottom of the trench.

* * * * *